(12) United States Patent
Fu et al.

(10) Patent No.: US 8,952,411 B2
(45) Date of Patent: Feb. 10, 2015

(54) LIGHT EMITTING DIODE

(71) Applicant: Industrial Technology Research Institute, Hsinchu (TW)

(72) Inventors: Yi-Keng Fu, Hsinchu County (TW); Rong Xuan, New Taipei (TW); Hsun-Chih Liu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/080,805

(22) Filed: Nov. 15, 2013

(65) Prior Publication Data

US 2014/0131732 A1        May 15, 2014

Related U.S. Application Data

(60) Provisional application No. 61/727,090, filed on Nov. 15, 2012.

(51) Int. Cl.
*H01L 33/00* (2010.01)
*H01L 33/12* (2010.01)
*H01L 33/20* (2010.01)

(52) U.S. Cl.
CPC ............... *H01L 33/12* (2013.01); *H01L 33/20* (2013.01)
USPC ............................... 257/98; 257/99; 257/103

(58) Field of Classification Search
USPC .............................................. 257/98, 99, 103
See application file for complete search history.

(56) References Cited

U.S. PATENT DOCUMENTS

| | | | | |
|---|---|---|---|---|
| 7,888,694 | B2 * | 2/2011 | Lee et al. | 257/98 |
| 7,935,554 | B2 * | 5/2011 | Lee et al. | 438/42 |
| 8,183,068 | B2 * | 5/2012 | Lee et al. | 438/29 |
| 2005/0040407 | A1 * | 2/2005 | Kohda | 257/79 |
| 2005/0145873 | A1 * | 7/2005 | Pan et al. | 257/103 |
| 2009/0283868 | A1 * | 11/2009 | Krause et al. | 257/618 |
| 2011/0186863 | A1 * | 8/2011 | Lee et al. | 257/79 |
| 2013/0259079 | A1 * | 10/2013 | Bhattacharya et al. | 372/45.01 |
| 2014/0030872 | A1 * | 1/2014 | Ha et al. | 438/478 |
| 2014/0110663 | A1 * | 4/2014 | Choi et al. | 257/13 |
| 2014/0191270 | A1 * | 7/2014 | Matsui et al. | 257/98 |
| 2014/0193982 | A1 * | 7/2014 | Yi et al. | 438/763 |

* cited by examiner

*Primary Examiner* — Ngan Ngo
(74) *Attorney, Agent, or Firm* — Jianq Chyun IP Office

(57) ABSTRACT

A light emitting diode device may include a carrier, a p-type and n-type semiconductor layers, an active layer, a first electrode and a second electrode is provided. The carrier has a growth surface and at least one nano-patterned structure on the growth surface, in which the carrier includes a substrate and a semiconductor capping layer disposed between the substrate and the n-type semiconductor layer. The n-type semiconductor layer and the p-type semiconductor layer are located over the growth surface of the carrier. The active layer is located between the n-type and p-type semiconductor layers, in which a wavelength λ of light emitted by the active layer is 222 nm≤λ≤405 nm, and a defect density of the active layer is less than or equal to $5 \times 10^{10}/cm^2$. The first and second electrodes are respectively connected to the n-type and p-type semiconductor layers. A carrier for carrying a semiconductor layer is also provided.

17 Claims, 28 Drawing Sheets

LIGHT EMITTING DIODE

CROSS-REFERENCE TO RELATED APPLICATION

This application claims the priority benefits of U.S. provisional application Ser. No. 61/727,090, filed on Nov. 15, 2012. The entirety of the above-mentioned patent application is hereby incorporated by reference herein and made a part of this specification.

TECHNICAL FIELD

The disclosure relates to a light emitting diode (LED) and an LED capable of enhancing luminous intensity.

BACKGROUND

A light emitting diode (LED) is a semiconductor device constituted mainly by group III-V compound semiconductor materials, for instance. Such semiconductor materials have a characteristic of converting electricity into light. Hence, when a current is applied to the semiconductor materials, electrons therein would be combined with holes and release excessive energy in a form of light, thereby achieving an effect of luminosity.

When the luminous wavelength of the LED gradually shifts from blue to the ultraviolet wavelengths of light, due to the lattice constant, the thermal expansion coefficient and the chemical properties of the sapphire are different from those of the gallium nitride/aluminum nitride, the gallium nitride/aluminum nitride growing on the heterogeneous substrate (such as, silicon substrate, silicon carbide substrate and sapphire substrate) possesses a large quantity of defects and dislocations. As the growth thickness of a buffer layer (e.g., gallium nitride or aluminum nitride) increases, these dislocations may extend toward a thickness direction of the buffer layer. As such, the lattice dislocation reduces the light emitting efficiency of the LED and shortens lifetime thereof.

Various approaches have been proposed to reduce such defects and dislocations. Although dislocation extending upwards may not be apt to exist in a portion of the buffer layer with certain approaches, the defect density of the LED remains relatively high as the luminous wavelength of the LED shifts to the ultraviolet wavelengths of light, the buffer layer requires to grow to a certain thickness (such as, greater than 10 μm) and coalescence of the nitride semiconductor layer is difficult to be achieved, thereby drastically decreasing the luminous intensity of the LED at the ultraviolet wavelengths. As a result, manufacturers in the pertinent art endeavour to develop LED with satisfactory luminous efficiency.

SUMMARY

A light emitting diode (LED) device and a carrier for carrying a semiconductor layer are provided in the disclosure. By having at least one nano-patterned structure on a growth surface of the carrier, the defect density of a nitride semiconductor layer may be decreased effectively where coalescence of the nitride semiconductor layer may easily be achieved with a thickness of a semiconductor layer grown above the nano-patterned structure being reduced, and thus the luminous intensity of the LED at the 222 nm-405 nm wavelength range can be enhanced at ultraviolet wavelengths less than 365 nm.

According to an exemplary embodiment of the disclosure, an LED that includes a carrier, an n-type semiconductor layer, a p-type semiconductor layer, an active layer, a first electrode and a second electrode is provided. The carrier includes a substrate and a semiconductor capping layer disposed between the substrate and the n-type semiconductor layer. The n-type semiconductor layer and the p-type semiconductor layer are located over a growth surface of the carrier. The active layer is located between the n-type semiconductor layer and the p-type semiconductor layer, in which a wavelength $\lambda$ of light emitted by the active layer is 222 nm$\leq\lambda\leq$405 nm, and a defect density of the active layer is less than or equal to $5\times10^{10}/cm^2$. The first electrode and the second electrode are connected to the n-type semiconductor layer and the p-type semiconductor layer, respectively.

According to an exemplary embodiment of the disclosure, a carrier for carrying a semiconductor layer which has a growth surface and at least one nano-patterned structure on the growth surface is provided. The at least one nano-patterned structure on the growth surface of the carrier has a plurality of mesas, a recess is formed between two adjacent mesas, in which a depth of the recess ranges from 10 nm to 500 nm, and a dimension of the mesa ranges from 10 nm to 800 nm.

To recapitulate, in the LED device according to the embodiments of the disclosure, by having the at least one nano-patterned structure on the growth surface of the carrier, the lattice dislocation extending in a thickness direction can be effectively decreased and the thickness of the semiconductor layer grown to be coalesced on the nano-patterned structure can also be reduced. The afore-described carrier may be incorporated with any one of certain configurations of the active layer (that is, a layer number of doped quantum barrier layers and a thickness of the quantum barrier layers satisfy certain relationships, an insertion of interlayer, a portion of the quantum wells having at least one pair of light emitting layer and auxiliary layer), such that the carrier recombination rate of the LED can be enhanced, and the defect density of the LED can also be reduced. Accordingly, the luminous intensity of the LED at the 222 nm-405 nm wavelength range in the disclosure can be drastically increased at ultraviolet wavelengths less than 365 nm.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

Figure 1:
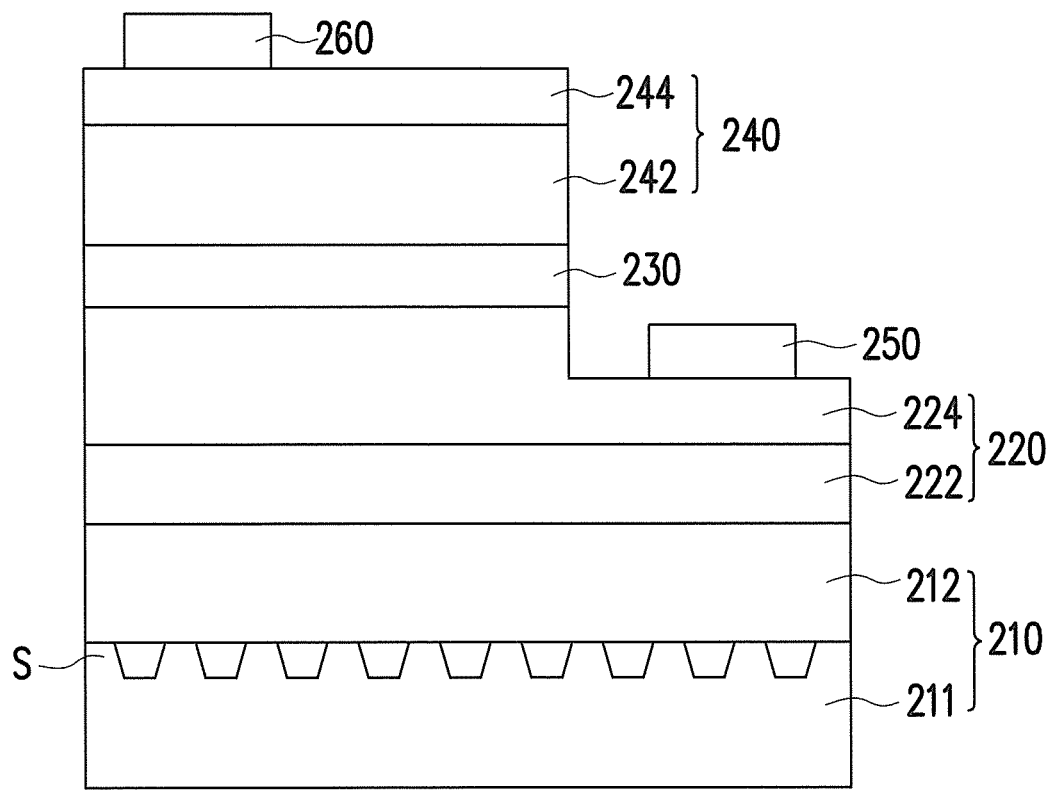
FIG. 1 is a schematic cross-sectional diagram illustrating an LED device according to an exemplary embodiment.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 is a schematic cross-sectional diagram illustrating an LED device according to an exemplary embodiment. Referring to FIG. 1, an LED device 200 includes a carrier 210, an n-type semiconductor layer 220, an active layer 230, a p-type semiconductor layer 240, a first electrode 250, and a second electrode 260. The carrier 210 includes a substrate 211 and a semiconductor capping layer 212, in which the substrate 211 is, for instance, a sapphire substrate, a gallium nitride (GaN) substrate, a silicon substrate, a silicon carbide (SiC) substrate or an aluminum nitride (AlN) substrate, and the semiconductor capping layer 212 is, for instance, an un-doped GaN layer or an un-doped AlN layer, where the sapphire substrate and the un-doped AlN semiconductor capping layer are employed to illustrate in the disclosure, although the disclosure is not limited thereto. In the embodiments of the disclosure, AlN is utilized as the material of the semiconductor capping layer instead of GaN, this is due to the energy bandgap of AlN is higher than that of GaN, such that the light absorption may be prevented. The semiconductor capping layer 212 of the carrier 210 may be disposed between the substrate 211 and the n-type semiconductor layer 220. For example, the stacking layers of the semiconductor capping layer 212, the n-type semiconductor layer 220, the active layer 230 and the p-type semiconductor layer 240 are formed on a surface of the substrate 211 (i.e., sapphire substrate).

The active layer 230 is disposed between the n-type semiconductor layer 220 and the p-type semiconductor layer 240, in which a wavelength λ of light emitted by the active layer 230 is 222 nm≤λ≤405 nm, and a defect density of the active layer 230 is less than or equal to $5\times10/cm^2$, preferably less than or equal to $2.5\times10^{10}/cm^2$, and more preferably less than or equal to $5\times10^9/cm^2$. The n-type semiconductor layer 220 may include the stacking layers of a first n-type doped AlGaN layer 222 and a second n-type doped AlGaN layer 224 disposed on the semiconductor capping layer 212. The p-type semiconductor layer 240 may include the stacking layers of a first p-type doped AlGaN layer 242 and a second p-type doped AlGaN layer 244 disposed sequentially on the active layer 230. It should be noted that a difference between the first n-type doped AlGaN layer 222 and the second n-type doped AlGaN layer 224 or a difference between the first p-type doped AlGaN layer 242 and the second p-type doped AlGaN layer 244, may be in thickness or in doping concentration. Besides, a material of the n-type semiconductor layer 220 (including the first n-type doped layer 222 and the second n-type doped layer 224) and the p-type semiconductor layer 240 (including the first p-type doped layer 242 and the second p-type doped layer 244) may be GaN, for instance, although the disclosure is not limited thereto.

To be more specific, as shown in FIG. 1, the semiconductor capping layer 212 (e.g. un-doped GaN or un-doped AlN), the first n-type doped AlGaN layer 222 and the second n-type doped AlGaN layer 224, the active layer 230, the first p-type doped AlGaN layer 242, and the second p-type doped AlGaN layer 244 are formed on the substrate 211, in which a defect density of the semiconductor capping layer 212 is less than or equal to $1\times10^{10}/cm^2$, preferably less than or equal to $5\times10^9/cm^2$, and more preferably less than or equal to $1\times10^9/cm^2$. Moreover, the first electrode 250 and the second electrode 260 are respectively formed on a portion of the second n-type doped AlGaN layer 224 and the second p-type doped AlGaN layer 244, such that the first electrode 250 is electrically connected to the n-type semiconductor layer 220, and the second electrode 260 is electrically connected to the p-type semiconductor layer 240. Certainly, a nitride buffer layer may also be added between the substrate 211 and the n-type semiconductor 220, although the disclosure is not limited thereto. According to requirements in practice, those skilled in the art may select the thickness, the doping concentration, and the aluminum concentration for growth of the semiconductor capping layer 212, the first n/p-type doped AlGaN layers 222 and 242, the second n/p-type doped AlGaN layers 224 and 244, although the disclosure is not limited thereto.

Figure 2A:
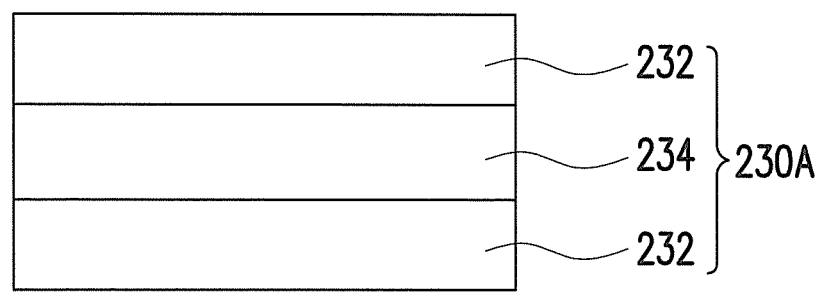
FIG. 2A is a schematic cross-sectional diagram illustrating an active layer having a single quantum well structure in an LED device according to an exemplary embodiment.
Figure 2B:
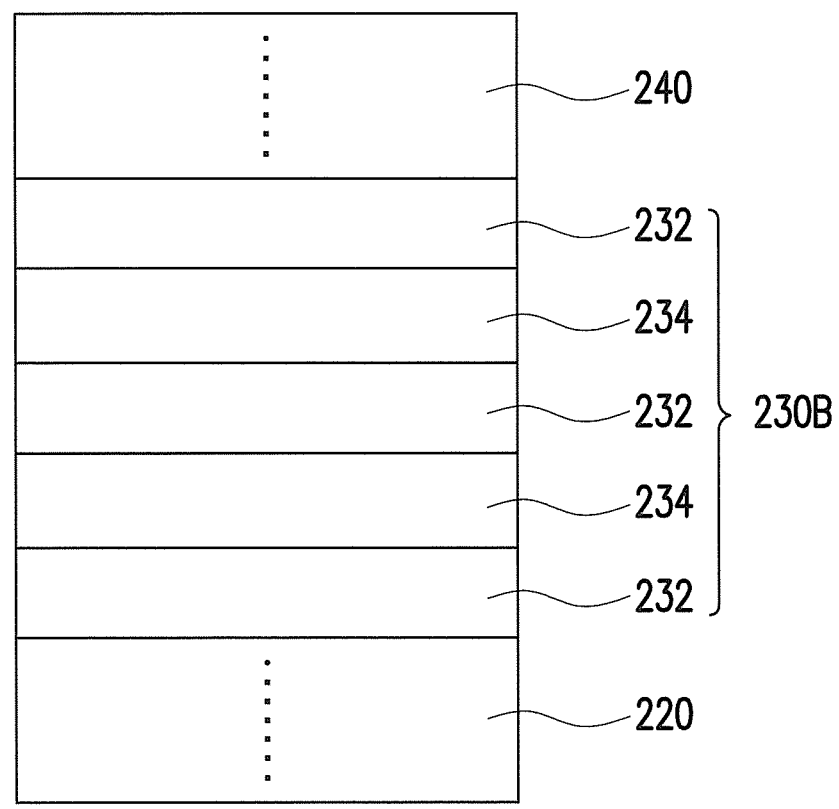
FIG. 2B is a schematic cross-sectional diagram illustrating an active layer having a multi-quantum well structure in an LED device according to an exemplary embodiment.

The active layer 230, as shown in FIG. 2A and FIG. 2B, may be composed of a single quantum well (i.e., a single quantum well active layer 230A) or multiple quantum wells (i.e., a multi-quantum well active layer 230B). FIG. 2A is a schematic cross-sectional diagram illustrating an active layer having a single quantum well structure in an LED device according to an exemplary embodiment. FIG. 2B is a schematic cross-sectional diagram illustrating an active layer having a multi-quantum well structure in an LED device according to an exemplary embodiment. In general, the active layer 230 includes i quantum wells and (i+1) quantum barrier layers. Each of the quantum wells is located between any two quantum barrier layers, and i is a natural number greater than or equal to 1. For instance, as shown in FIG. 2A, the single quantum well active layer 230A may be formed by two quantum barrier layers 232 and a quantum well 234 sandwiched therebetween, thus constituting a quantum barrier layer 232/quantum well 234/quantum barrier layer 232 structure. Taking the LED device 200 with an emitted wavelength of 222 nm-405 nm as an example, a material of the quantum barrier layers 232 is $Al_xIn_yGa_{1-x-y}N$, wherein $0 \le x \le 1$, $0 \le y \le 0.3$, and $x+y \le 1$. Moreover, a material of the quantum well 234 may be $Al_mIn_nGa_{1-m-n}N$, wherein $0 \le m < 1$, $0 \le n \le 0.5$, $m+n \le 1$, $x > m$, and $n \ge y$. According to requirements in practice (such as different emitted wavelengths), those skilled in the art may select the concentrations of m and n or x and y for growth, although the disclosure is not limited thereto.

As shown in FIG. 2B, the active layer 230 may be composed of multiple quantum wells (i.e., the multi-quantum well active layer 230B). The multi-quantum well active layer 230B may be formed by at least two pairs of stacked quantum barrier layers 232 and quantum wells 234. For instance, the multi-quantum well active layer 230B in FIG. 2B comprises three pairs of stacked quantum barrier layers 232/quantum wells 234. Additionally, in the embodiments of the disclosure where the luminous wavelength is 365 nm, the material of the quantum wells is $In_cGa_{1-c}N$, in which $0 \le c \le 0.05$, and the material of the quantum barrier layers is $Al_dGa_{1-d}N$, in which $0 \le d \le 0.25$. In the embodiment, the preferable aluminum concentration is between 0.09 and 0.20, and the thickness of the quantum barrier layer is 5 nm-15 nm, for instance. The preferable thickness of the quantum barrier layer is 6 nm-11 nm in the embodiment.

Figure 3:
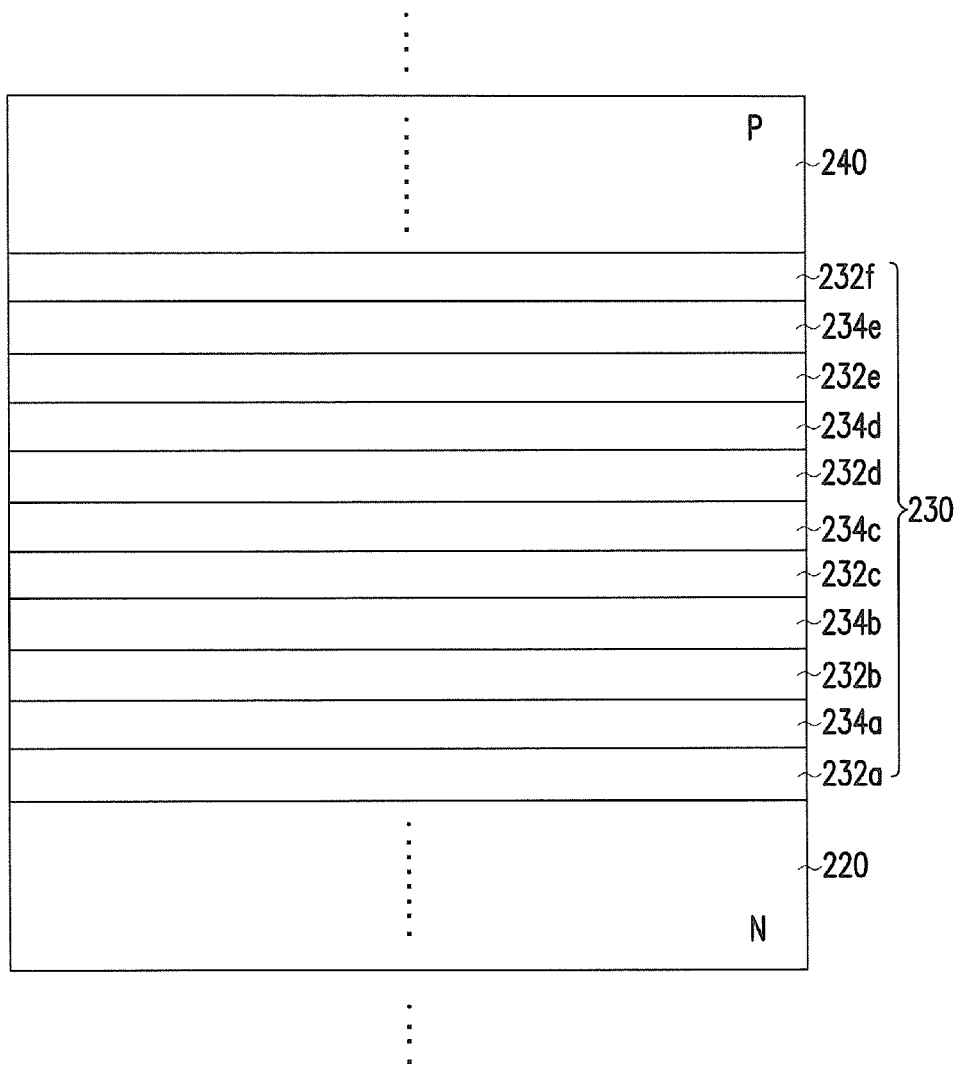
FIG. 3 is an enlarged schematic cross-sectional diagram illustrating an active layer in an LED device according to an exemplary embodiment.

FIG. 3 is an enlarged schematic cross-sectional diagram illustrating an active layer in an LED device according to an exemplary embodiment. Referring to FIG. 3, the active layer 230 described in the present embodiment includes five quantum wells 234a-234e and six quantum barrier layers 232a-232f. Each of the quantum wells 234a-234e is located between any two of the quantum barrier layers 232a-232f. The quantum barrier layers 232a-232f, counting from the n-type semiconductor layer 220, are sequentially 232a, 232b, 232c, 232d, 232e, and 232f, and the quantum wells 234a-234e, counting from the n-type semiconductor layer 220, are sequentially 234a, 234b, 234c, 234d, and 234e.

In the embodiments of the disclosure, the semiconductor capping layer 212, the n-type semiconductor layer 220, the active layer 230 and the p-type semiconductor layer 240 are deposited on the substrate 211 by a metal organic chemical vapor deposition (MOCVD). However, the fabrication process of the semiconductor capping layer 212, the n-type semiconductor layer 220, the active layer 230 and the p-type semiconductor layer 240 is not limited to the above-mentioned MOCVD process, other suitable processes may be adapted in this disclosure.

Moreover, in the embodiments hereafter, silicon is used as the n-type dopant as an exemplary scope for implementation, although those skilled in the art may also use other elements in the same group IVA as silicon to implement the embodiments in the disclosure by substituting the silicon. Alternatively, other elements in group V or group VIA such as arsenic, phosphorus or oxygen to implement the embodiments in the disclosure by substituting the silicon.

An epitaxial layer of aluminum nitride tends to grow on a substrate in a three-dimensional mode instead of a two-dimensional mode due to the growth properties of aluminum nitride, so that the laterally coalescence of such AlN layer becomes difficult. A thickness of the AlN epitaxial layer to be coalesced by the subsequent growth is relatively thicker (for instance, is often greater than 10 μm) and a longer growth time is also required. Other epitaxial materials to be deposited on the substrate, except aluminum nitride, may not have the issue of laterally coalescence, cracks may be easily caused when these materials are deposited on the plane substrate. As such, in the embodiments of the disclosure, a carrier having at least one pattern structure on a growth surface is provided so as to reduce the growth time and the required growth thickness to be coalesced, and the defect density of the LED device is also reduced due to the nano-scale of the at least one pattern structure.

For example, in the LED device 200 of the disclosure (as shown in FIG. 1), at least one nano-patterned structure S may be formed on a growth surface of the carrier 210, such that a distance for the laterally growth of layers being deposited on the nano-patterned structure S can be shortened as an epitaxy process is performed, thereby reducing the growth time and the required thickness of the subsequent grown AlN layer to be coalesced. The epitaxy process includes a hydride vapor phase epitaxy (HVPE), a Molecular Beam Epitaxy (MBE) or a metal-organic vapor-phase epitaxy (MOVPE), and the fabrication of the nano-patterned structure S to the carrier 210 includes any process such as dry etching process, wet etching process, photo-lithographical process, or other process known by a person in the art, although the disclosure is not limited thereto. For example, the nano-patterned structure S after being etched includes a plurality of patterns, in which each of the patterns can be a cylinder, a spheroid, a pyramid or a polygon, where an orthographic projection of each pattern on the carrier 210 may be a circular shape, a semi-circular shape, an elliptical shape, a square shape, an equilateral triangular shape, an isosceles triangular shape, a rectangular shape, a trapezoidal shape, a parallelogram shape, a hexagonal shape or a crossed shape, or other bodies/shapes applicable for epitaxy to be deposited thereon, although the disclosure is not limited thereto.

Figure 4A:
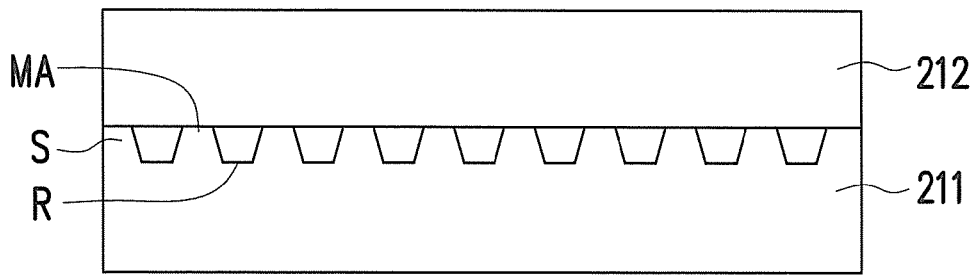
FIG. 4A is an implementation of the carrier depicted in FIG. 1.
Figure 4B:
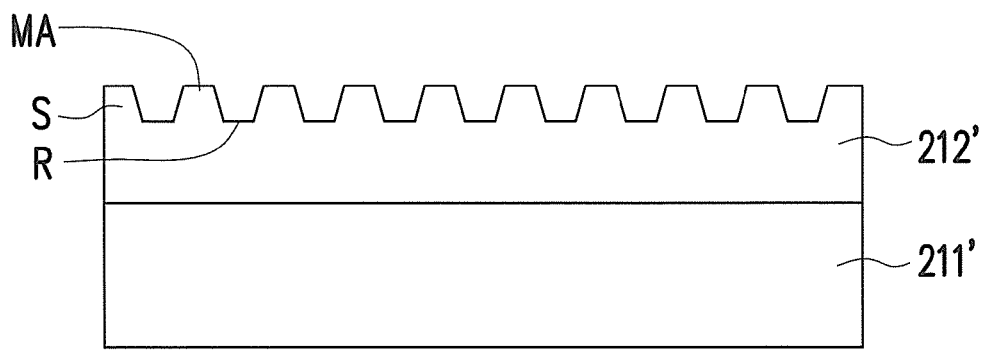
FIG. 4B is another implementation of the carrier depicted in FIG. 1.
Figure 4C:
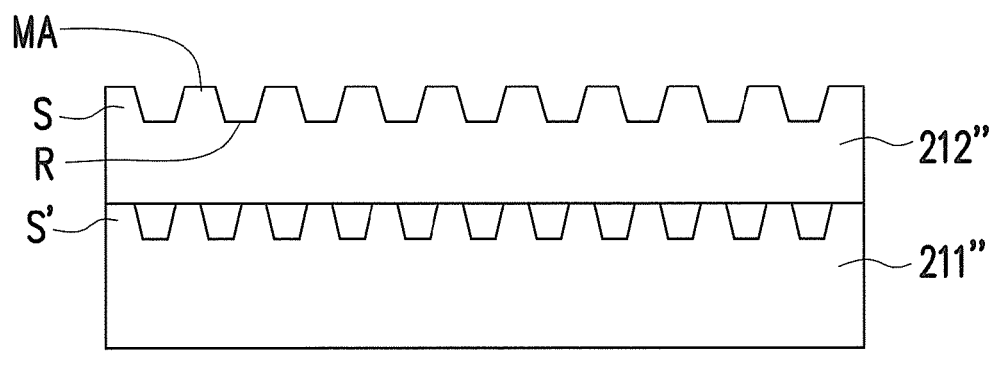
FIG. 4C is yet another implementation of the carrier depicted in FIG. 1.

FIG. 4A is an implementation of the carrier depicted in FIG. 1. Referring to FIG. 4A, the nano-patterned structure S is formed on a surface of the substrate 211, and the semiconductor capping layer 212 covers and is in contact with the nano-patterned structure S. FIG. 4B is another implementation of the carrier depicted in FIG. 1. Referring to FIG. 4B, the substrate 211' has a plane surface, the semiconductor capping layer 212' covers the plane surface of the substrate 211'. The nano-patterned structure S is formed on a surface of the semiconductor capping layer 212', and the n-type semiconductor layer 220 covers and is in contact with the nano-patterned structure S. Furthermore, FIG. 4C is yet another implementation of the carrier depicted in FIG. 1. Referring to FIG. 4C, the substrate 211" has a patterned surface S', the semiconductor capping layer 212" covers the patterned surface S' of the substrate 211", the nano-patterned structure S is foamed on a surface of the semiconductor capping layer 212", and the n-type semiconductor layer 220 covers and is in contact with the nano-patterned structure S. The patterned surface S' depicted in FIG. 4C is not limited to the nano-scale, the surface S' may be the micro-patterned scale, or may become the micro- and nano-patterned scale after the laterally growth of the semiconductor capping layer 212", the disclosure is not limited to the scale of the patterned surface S' of the substrate 211", as long as such surface is patterned for the subsequent epitaxial growth thereon.

As shown in FIG. 4A through FIG. 4C, the plane semiconductor capping layer 212 and the nano-patterned semiconductor capping layers 212', 212" are respectively formed on the substrate 211 (i.e., nano-patterned substrate), the plane substrate 211' and the patterned substrate 211", through MOCVD process. The thickness of the formed semiconductor capping layers 212, 212', 212" may be less than or equal to 10 µm, less than or equal to 7 µm, or less than or equal to 5 µm, in which the thickness preferably ranges from 1 µm to 4 µm. A material of the semiconductor capping layer in the embodiments includes gallium nitride (GaN), aluminum gallium nitride (AlGaN), aluminum nitride (AlN), indium gallium nitride (InGaN) or a combination thereof.

Specifically, the nano-patterned structure S comprises a plurality of mesas MA, and a recess R is formed between two adjacent mesas MA, on the growth surface of the carrier 210. For example, during the epitaxy process is performed on the nano-patterned structure S on the surface of the substrate 211 to form the semiconductor capping layer 212, the semiconductor capping layer 212 is laterally grown from a top surface of each mesa MA, and then the semiconductor capping layer 212 is coalesced on the nano-patterned structure S, as shown in FIG. 4A. Due to the dimension of the mesas MA are in nano-scale, the distance between the two adjacent mesas for the semiconductor capping layer 212 to be coalesced is shortened, such that the thickness of the semiconductor capping layer 212 to be coalesced is less than the means without the nano-patterned structure S (which is usually greater than 10 µm), and the time for epitaxial growth may be reduced. Moreover, since the semiconductor capping layer 212 is laterally grown on the top surface of each nano-scale mesa MA to cover the substrate 211, the lattice dislocation extending in the thickness direction can be effectively reduced in the carrier 210, and epitaxial defects generated by lattice mismatch are further prevented, thereby the luminous intensity of the LED device at the 222 nm-405 nm wavelength range is enhanced at ultraviolet wavelengths less than 365 nm.

Similarly, through the nano-patterned structure S on the semiconductor capping layer 212' as shown in FIG. 4B and the nano-patterned structure S on the semiconductor capping layer 212" above the patterned substrate 211" as shown in FIG. 4C, the first n-type doped AlGaN layer 222 laterally grown from the nano-patterned structure S is coalesced on the carriers 210' and 210", respectively, where the required thickness and the defect density of the epitaxial layers on the nano-patterned structure S (i.e., the first n-type doped AlGaN layer 222 and the semiconductor capping layer 212") may also be reduced concurrently.

Figure 5A:
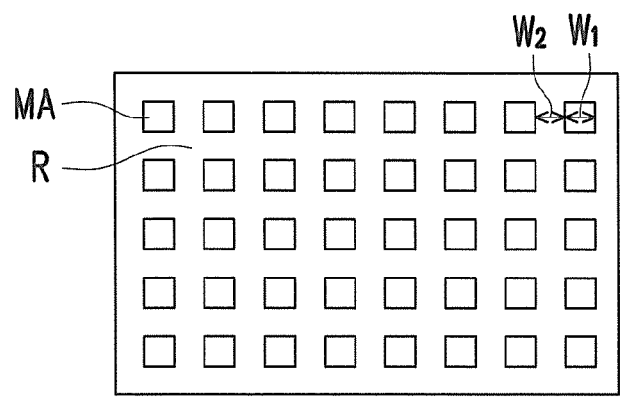
FIG. 5A and FIG. 5B are schematic top views of nano-patterned structures arranged regularly.
Figure 5B:
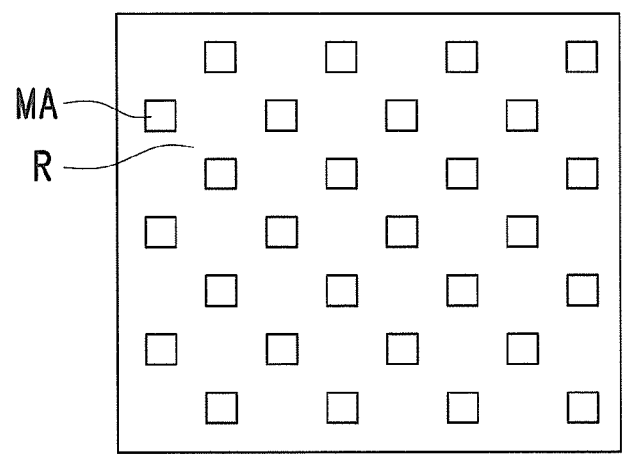
Figure 5C:
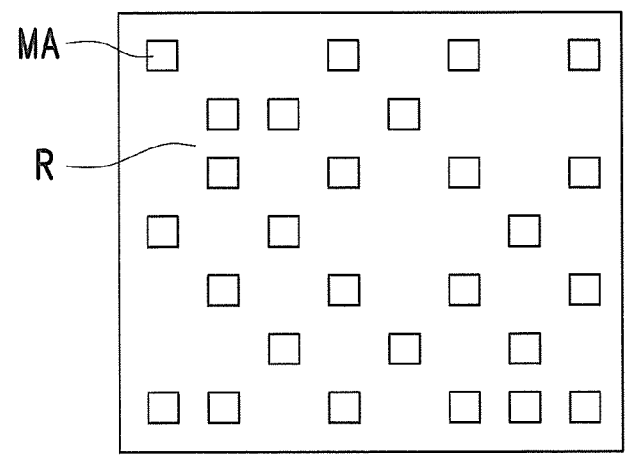
FIG. 5C is a schematic top view of a nano-patterned structures arranged randomly.

FIG. 5A and FIG. 5B are schematic top views of nano-patterned structures arranged regularly. FIG. 5C is a schematic top view of a nano-patterned structures arranged randomly. For example, the mesas MA of the nano-patterned structure S are formed by an etching process, in which these mesas MA may be arranged regularly (as shown in FIG. 5A and FIG. 5B) or randomly (as shown in FIG. 5C) on the growth surface of the carrier 210. The mesas MA being arranged regularly are employed to illustrate in the embodiments of the disclosure, although the disclosure is not limited thereto. After etching, the depth of each recess R ranges from 10 nm to 500 nm, preferably 50 nm to 400 nm, and more preferably 100 nm to 300 nm, and the dimension of each mesa MA ranges from 10 nm to 800 nm, preferably between 50 nm to 700 nm, and more preferably between 100 nm to 500 nm, where the dimension indicates the diameter of the mesa MA and the depth of the recess R also implies the depth of the mesa MA. The plurality of recesses R surround each of the mesas MA, and are interconnected with each other. Alternatively, each of the mesas MA may be formed in a strip-shape and arranged regularly or randomly across on the growth surface of the carrier, while each of the recesses R is also formed in strip-shape and located between two adjacent mesas MA, in which the recesses R are discontinuous and separated from each other by the mesas MA. In the embodiments, a dimension $w_1$ of the mesa MA and a dimension $w_2$ of the recess R satisfy the following relationship: $0.0125 \leq [w_1/w_2] \leq 80$, preferably $0.07 \leq [w_1/w_2] \leq 14$, and more preferably $0.2 \leq [w_1/w_2] \leq 5$.

Meanwhile, as the depth of the mesas MA increases (namely, increasing the thickness of the nano-patterned structure S), the epitaxy to be deposited on the top surface of the mesas MA is increased, and the contact area between the substrate 211 and the nitride epitaxial layer (such as, the semiconductor capping layer 212 and the first n-type doped AlGaN layer 222) may be decreased, such that the stress resulted from thermal expansion mismatch and lattice mismatch may be reduced, thereby decreasing the probability of cracks occurred at a cooling stage after the fabrication of the LED device.

In order to further verify the deductions arrived at above, the effects of the nano-patterned structure S in the LED device 200 are further illustrated with support from the experimental results described below. In the embodiment hereafter, a 2 µm thick of a AlN semiconductor capping layer covers and is in contact with a plane substrate, a micro-patterned substrate and two nano-patterned substrates (with the pitches of 450 nm and 750 nm), respectively.

Figure 6A:
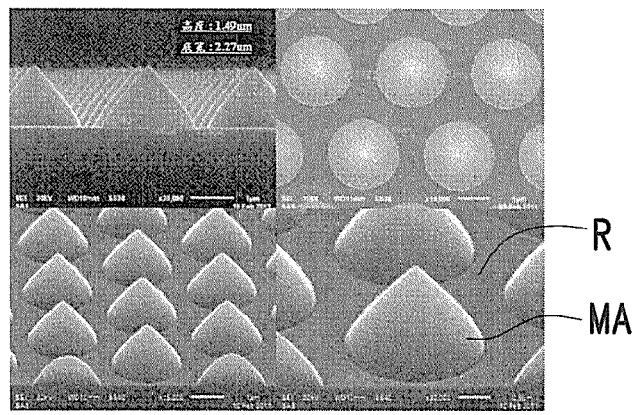
FIG. 6A is a scanning electron microscope (SEM) image illustrating a structure pattern of mesas on a growth surface in micro-scale.
Figure 6B:
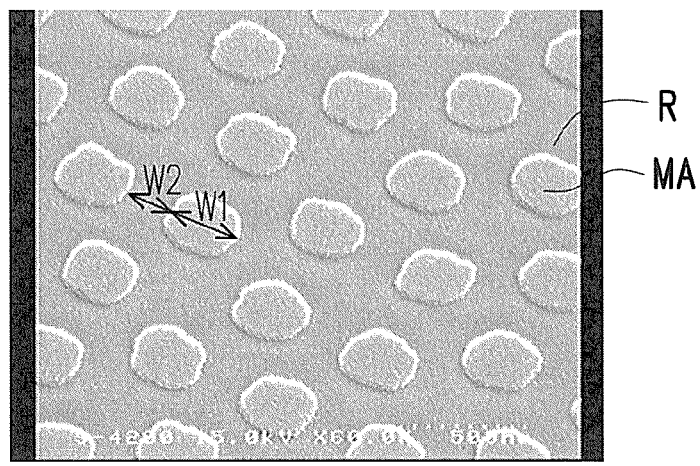
FIG. 6B and FIG. 6C respectively are SEM images illustrating structure patterns of mesas on a growth surface in nano-scale with different pitches.
Figure 6C:
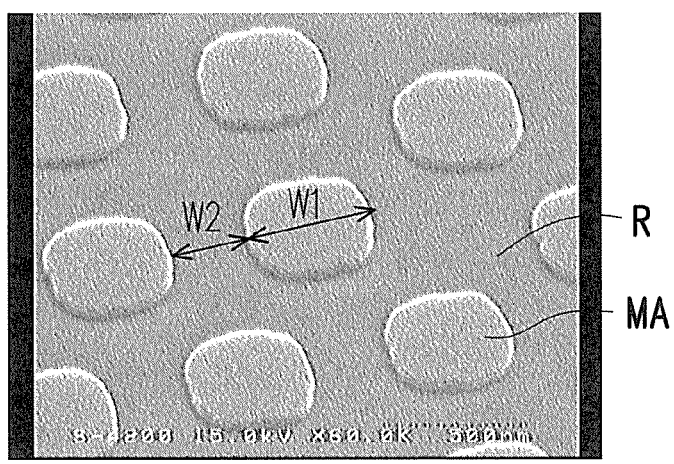

FIG. 6A is a scanning electron microscope (SEM) image illustrating a structure pattern of mesas on a growth surface in micro-scale. FIG. 6B and FIG. 6C respectively are SEM images illustrating structure patterns of mesas on a growth surface in nano-scale with different pitches. The pitch of the mesas MA depicted in FIG. 6B is 450 nm, and the pitch of the mesas MA depicted in FIG. 6C is 750 nm. The mesas MA depicted in FIG. 6A through FIG. 6C are arranged regularly, in which the depths of the mesa MA depicted in FIG. 6A through FIG. 6C respectively are 1.5 µm, 0.05 µm, 0.05 µm; the dimensions $w_1$ of the mesa MA depicted in FIG. 6A through FIG. 6C respectively are 2.27 µm, 0.45 µm, 0.7 µm; and the dimensions $w_2$ of the recess R depicted in FIG. 6A through FIG. 6C respectively are 0.78 µm, 0.45 µm, 0.7 µm.

Figure 7A:
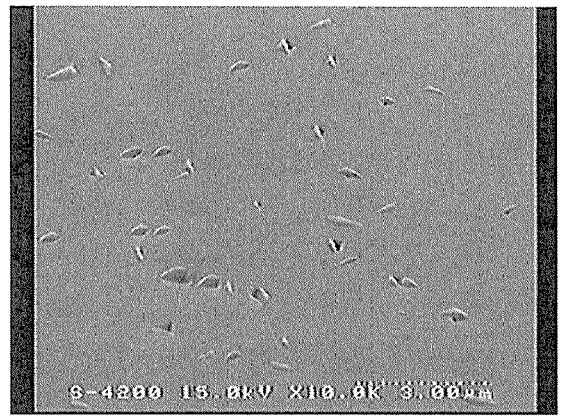
FIG. 7A through FIG. 7C are SEM images illustrating a top view of a AlN semiconductor capping layer respectively covered a plane substrate, a micro-patterned substrate depicted in FIG. 6A and a nano-patterned substrate depicted in FIG. 6B.
Figure 7B:
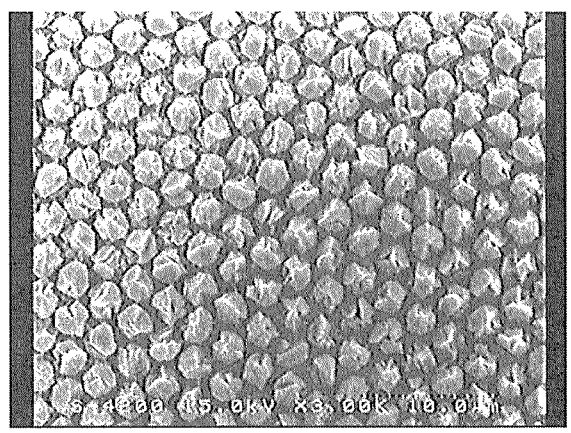
Figure 7C:
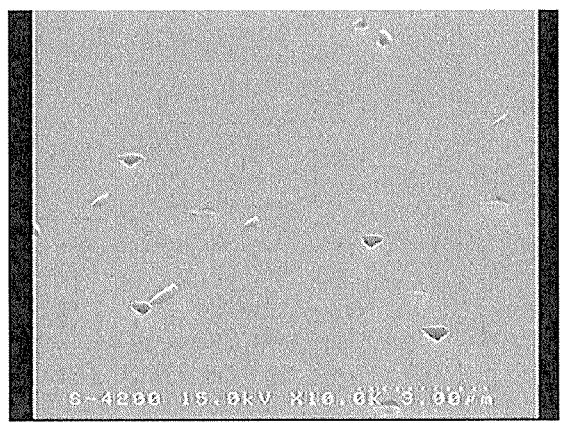

FIG. 7A through FIG. 7C are SEM images illustrating a top view of a AlN semiconductor capping layer respectively covered a plane substrate, a micro-patterned substrate depicted in FIG. 6A and a nano-patterned substrate depicted in FIG. 6B. Referring to FIG. 6A-FIG. 6C and FIG. 7A-FIG. 7C together, an X-ray diffraction (XRD) analysis is performed on a (0,0,2) crystal orientation and a (1,0,2) crystal orientation of the plane substrate, the micro-patterned substrate depicted in FIG. 6A and the nano-patterned substrate depicted in FIG. 6B. The impact on the X-ray diffraction analysis resulting from different structures of the substrates is shown in Table 1.

TABLE 1

|  | (0,0,2) crystal orientation (arcsec) | (1,0,2) crystal orientation (arcsec) |
| --- | --- | --- |
| Plane Substrate | 270 | 750 |
| Micro-patterned Substrate | X | X |
| Nano-patterned Substrate | 310 | 620 |

As shown in the results of Table 1 and FIG. 7A through FIG. 7C, under the specific thickness (i.e., 2 µm) of the AlN semiconductor capping layer on the growth surface of the substrate, the X-ray diffraction analysis to the (0,0,2) crystal orientation of the semiconductor capping layer on the plane substrate is 270 arcsec, on the nano-patterned substrate depicted in FIG. 6B is 310 arcsec, and on the micro-patterned substrate depicted in FIG. 6A can not be measured in the exemplary embodiment. Furthermore, the X-ray diffraction analysis to the (1,0,2) crystal orientation of the semiconductor capping layer on the plane substrate is 750 arcsec, on the nano-patterned substrate depicted in FIG. 6B is 620 arcsec, and on the micro-patterned substrate depicted in FIG. 6A, again, can not be measured in the exemplary embodiment. The X-ray diffraction analysis to the (0,0,2) and (1,0,2) crystal orientations of the semiconductor capping layer on the micro-patterned substrate depicted in FIG. 6A both fail to be measured in the exemplary embodiment, which illustrates the surface is incapable of being coalesced such that no measurements are taken.

Therefore, it can deduced from Table 1 that the semiconductor capping layer covered the plane substrate and the nano-patterned substrate depicted in FIG. 6B can be coalesced to a mirror-like even surface, whereas the semiconductor capping layer covered the micro-patterned substrate depicted in FIG. 6A fails to coalesce to the even surface as the other two described above when the epitaxial growth thickness of the semiconductor capping layer is limited below 10 µm. The surface of the semiconductor capping layer on the micro-patterned substrate depicted in FIG. 6A remains uneven, as shown in FIG. 7B. The micro-patterned substrate depicted in FIG. 6A causes coalescence of the semiconductor capping layer difficult to be achieved subsequently.

Figure 8A:
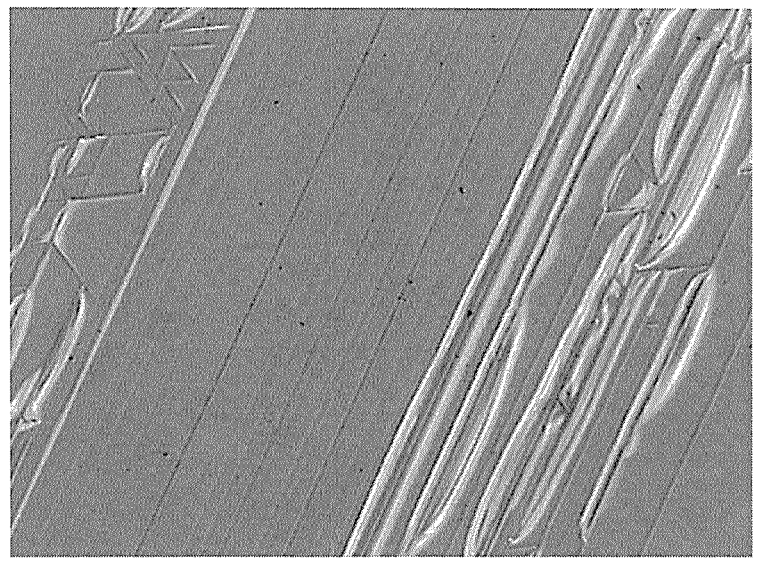
FIG. 8A and FIG. 8B are SEM images of surfaces of the AlN semiconductor capping layer respectively covered the plane substrate and the nano-patterned substrate depicted in FIG. 7A and FIG. 7C.
Figure 8B:
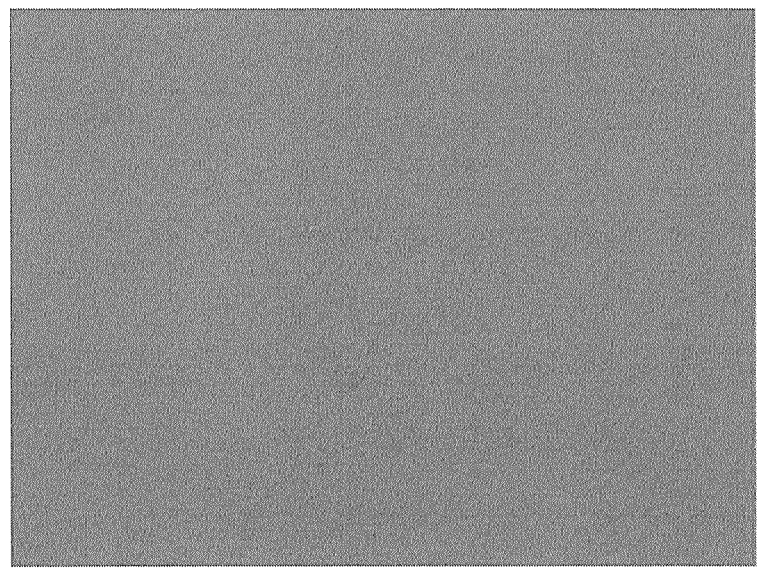

As shown in FIG. 7A and FIG. 7C, the crack density of the semiconductor capping layer on the plane substrate is relatively higher than that of the nano-patterned substrate depicted in FIG. 6B, although the two configurations achieved coalescing to the mirror-like even surface. FIG. 8A and FIG. 8B are SEM images of surfaces of the AlN semiconductor capping layer respectively covered the plane substrate and the nano-patterned substrate depicted in FIG. 7A and FIG. 7C. The surface of the semiconductor capping layer on the plane substrate appears to be a cracked surface, as shown in FIG. 8A. By contrast, the surface of the semiconductor capping layer on the nano-patterned substrate appears to be a smooth and crack-free surface, as shown in FIG. 8B.

In other words, the stress resulted from thermal expansion mismatch and lattice mismatch is reduced between the semiconductor capping layer and the substrate due to the nano-patterned structure on the growth surface of the substrate, thereby decreasing the probability of cracks occurring in the semiconductor capping layer and/or the nitride semiconductor structure and improving the quality of LED device. Similarly, when the nano-patterned structure is either formed on the semiconductor capping layer with the plane substrate (as shown in FIG. 4B) or on the semiconductor capping layer with the patterned substrate (as shown in FIG. 4C), the stress resulted from thermal expansion mismatch and lattice mismatch can be reduced via the nano-patterned structure on the growth surface of the carrier, thereby decreasing the probability of cracks occurring in the semiconductor capping layer and/or the nitride semiconductor structure.

Figure 9A:
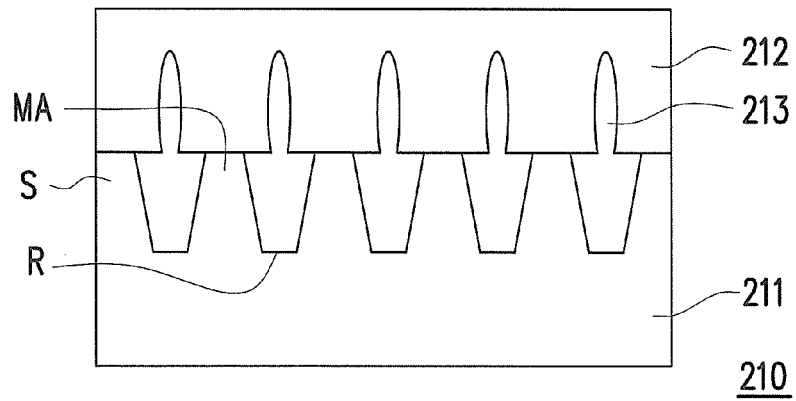
FIG. 9A through FIG. 9C are schematic cross-sectional diagrams illustrating a formation of voids above the nano-patterned structure depicted in FIG. 4A under various epitaxial conditions.
Figure 9B:
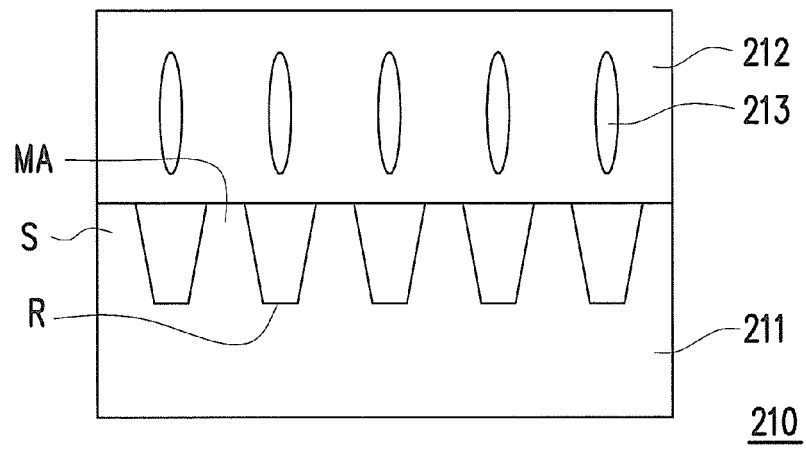
Figure 9C:
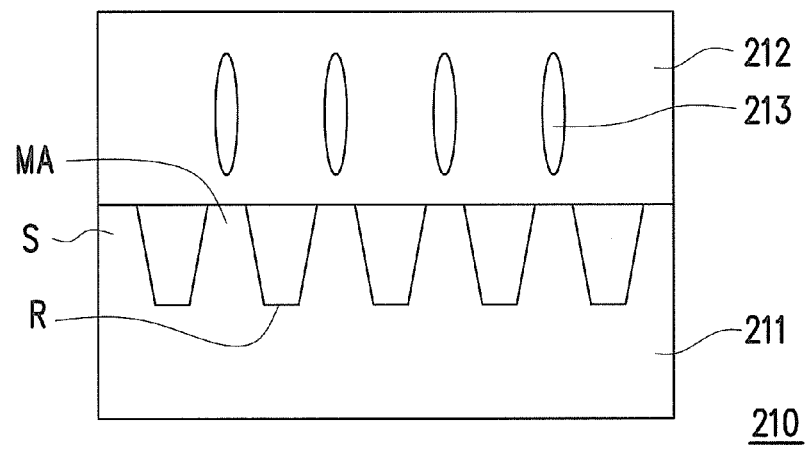

FIG. 9A through FIG. 9C are schematic cross-sectional diagrams illustrating a formation of voids above the nano-patterned structure depicted in FIG. 4A under various epitaxial conditions. According to the present embodiment, it is assumed that there are $p^{th}$ voids 213 having a refraction coefficient n2 formed in the semiconductor capping layer 212 having a refraction coefficient n3, above the substrate 211 (or the carrier 210) having a refraction coefficient n1, in which $1 \leq p$, and n3>n2>n1, where p is a natural number greater than or equal to 1. On these conditions, the improvement effect of the defect density and the required thickness to be coalesced for the epitaxial layer on the nano-patterned structure S are especially pronounced.

Referring to FIG. 9A, as the semiconductor capping layer 212 laterally grows on the top surface of each mesa MA to cover the nano-patterned structure S under the first epitaxial condition, a plurality of voids 213 are formed between these mesas MA when the semiconductor capping layer 212 is coalesced. Likewise, referring to FIG. 9B, as the semiconductor capping layer 212 laterally grows on the top surface of each mesa MA to cover the nano-patterned structure S under the second epitaxial condition, a plurality of voids 213 are formed between these mesas MA when the semiconductor capping layer 212 is coalesced. Alternatively, these voids 213 may also be formed between these mesas MA, namely, each of the voids 213 may be formed above each of the mesas MA between two adjacent recesses R, as shown in FIG. 9C. That is to say, each void 213 can be formed above each recess R between any two adjacent mesas MA (as shown in FIG. 9A and FIG. 9B) or can be formed above each mesa MA between any two adjacent recesses R (as shown in FIG. 9C), the locations of the voids 213 are not limited thereto, as long as formed above the nano-patterned structure S.

Similarly, the voids 213 may also be formed and applied to the nano-patterned structure S depicted in FIG. 4B, the nano-patterned structure S and the pattered surface S' depicted in FIG. 4C to reduce the thickness of the subsequent epitaxial semiconductor layer and the defect density of the LED device, so that the detailed description may be referred to the descriptions above, which is not repeated therein.

The difference among FIG. 9A through FIG. 9C is that the voids 213 are interconnected to the recesses R to form cone or columnar spaces in the carrier 210 in FIG. 9A, whereas the semiconductor capping layer 212 is coalesced firstly above the recesses R and the voids 213 are then formed above the coalesced portions of the semiconductor capping layer 212 above the recesses R in FIG. 9B or above the mesas MA in FIG. 9C. Although the cone and columnar shapes are employed to illustrate the voids 213, the shape of the voids 213 (which depends upon the given epitaxial condition) is not limited thereto. Furthermore, the location of the voids 213, for instance, in the semiconductor capping layer 212 is also not limited, those skilled in the art may determine the location of the voids 213 according to requirements in practice. Due to the existence of the voids 213 between the semiconductor capping layer 212 and the substrate 211, the carrier 210 has three different refraction coefficients (namely, n1 through n3), such that the total internal reflection effect in the LED device may be reduced through a refraction coefficient difference when light is emitted, thereby enhancing the power extraction of the LED device. Moreover, due to the nano-patterned structure S in the carrier 210, the thickness of the semiconductor layer laterally grown to be coalesced on the nano-patterned structure S may also be reduced, and the defect density of the nitride semiconductor layer may be decreased effectively.

The effects of the voids 213 in the disclosure are further illustrated with support from the experimental results described below. For instance, under the afore-described configuration of the embodiment (i.e., with the nano-patterned structure S and the voids 213 in the carrier 210), the thickness of the semiconductor capping layer 212 to be coalesced is less than or equal to 10 μm, preferably less than or equal to 7 μm, and more preferably less than or equal to 5 μm while the defect density of the semiconductor capping layer is less than or equal to $1 \times 10^{10}/cm^2$, preferably less than or equal to $5 \times 10^{9}/cm^2$, and more preferably less than or equal to $1 \times 10^{9}/cm^2$, and the defect density of active layer 230 is less than or equal to $5 \times 10^{10}/cm^2$, preferably less than or equal to $2.5 \times 10^{9}/cm^2$, and more preferably less than or equal to $5 \times 10^{9}/cm^2$. By contrast, the defect density of the active layer is about $1 \times 10^{11}/cm^2$ on the plane sapphire substrate although the thickness of the semiconductor capping layer 212 to be coalesced is less than 1 μm, while the thickness of the semiconductor capping layer 212 to be coalesced is greater than 5 μm and the defect density of the active layer ranges from $1 \times 10^{9}/cm^2$ to $1 \times 10^{11}/cm^2$ on the sapphire substrate with a micro-patterned structure. Thus, as illustrated above, an epitaxial semiconductor layer to be coalesced in an LED device may be thinner and the defect density of the LED device may also be reduced, with the nano-patterned structure and the voids between the substrate and the nitride semiconductor structure.

In addition, the formation of the voids 213 may be achieved either via increasing the depth of the mesas MA of the nano-patterned structure S or employing a mask layer to cover sidewalls of the mesas MA and a bottom surface of each recess R, for instance. Specifically, in the embodiments of the disclosure, a mask layer may be further employed above the nano-patterned structure S, other than increasing the depth of the mesas MA, so as to ensure the epitaxy of the semiconductor capping layer 212 and/or the first n-type doped AlGaN layer 222 to grow on the top surface of each mesa MA of the nano-patterned structure S. The afore-described methods are employed to illustrate the exemplary embodiments of the disclosure so as to reduce the thickness of the semiconductor capping layer to be coalesced and the probability of cracks, and the scope of the disclosure is not limited thereto.

Figure 10A:
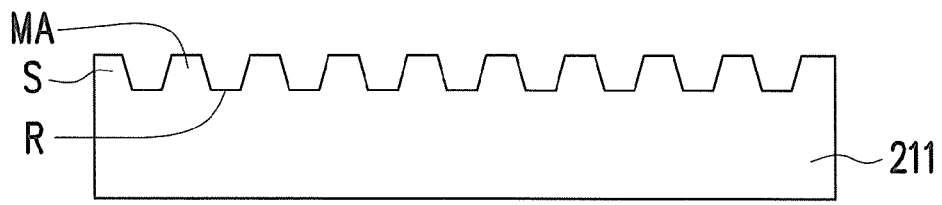
FIG. 10A through FIG. 10D are schematic cross-sectional diagrams illustrating a fabricating process of a mask layer on the nano-patterned structure depicted in FIG. 4A.
Figure 10B:
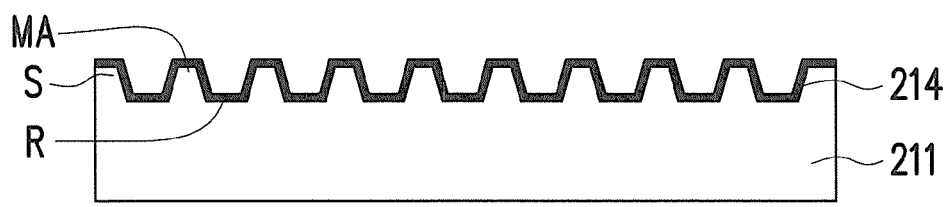
Figure 10C:
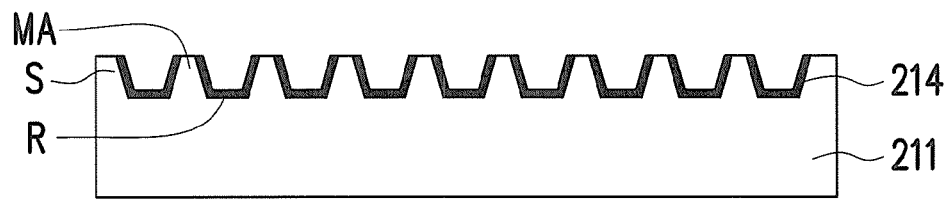
Figure 10D:
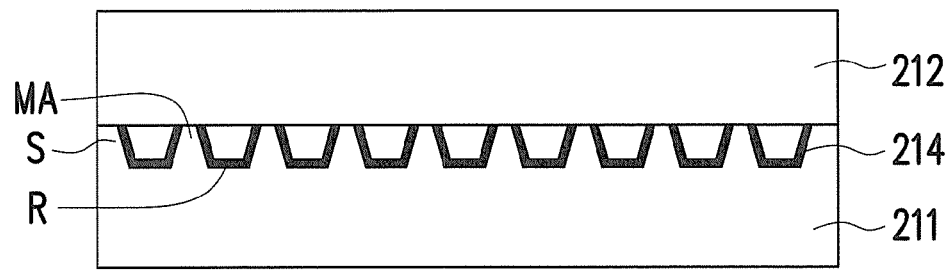

FIG. 10A through FIG. 10D are schematic cross-sectional diagrams illustrating a fabricating process of a mask layer on the nano-patterned structure depicted in FIG. 4A. Referring to FIG. 10A and FIG. 10B, the nano-patterned structure S is formed on the growth surface of the substrate 211 in the carrier 210. Next, the mask layer 214 of 0.1 μm to 2 μm is formed through a chemical vapor deposition (CVD) to cover the nano-patterned structure S on the substrate 211. Afterwards, a photo-lithographical process is performed on the mask layer 214, and then the mask layer 214 is partially removed by performing an etching process, so as to expose the top surface of each of the mesas MA. Accordingly, the mask layer 214 covers the sidewalls of each mesa MA and the bottom surface of each recess R between the two adjacent mesas MA, as shown in FIG. 10C. Thus, referring to FIG. 10D, as the semiconductor capping layer 212 laterally grows from the top surface of each mesa MA not covered by the mask layer 214 during the epitaxy process, the semiconductor capping layer 212 may not grow on the sidewalls of each mesa MA and the bottom surface of each recess R, and is coalesced above every recess R between the two adjacent mesas MA.

Under the configuration with the mask layer, the thickness of the semiconductor capping layer 212 to be coalesced may be achieved without being too thick, such that cracks between the semiconductor capping layer 212 and the nano-patterned structure S may be reduced. Specifically, the thickness of the semiconductor capping layer 212 is, for example, less than or equal to 5 μm, which facilitates the formation of the subsequent layers. The material of the mask layer 214 may be silicon dioxide ($SiO_2$), silicon nitride ($Si_3N_4$) or silicon oxynitride (SiON), for instance. Similarly, the mask layer 214 may also be applied to the nano-patterned structure S depicted in FIG. 4B, the nano-patterned structure S and the pattered surface S' depicted in FIG. 4C to ensure the epitaxity of the subsequent layer to grow the top surface of each mesa MA, so that the detailed description may be referred to the descriptions above, which is not repeated therein.

Accordingly, by having the nano-patterned structure on the growth surface of the carrier (namely, on the surface of the substrate, on the surface of the semiconductor capping layer, and on the surface of the semiconductor capping layer with the patterned surface of the substrate), the subsequent epitaxial semiconductor layer to be coalesced may be thinner and the defect density of the LED device may be reduced. Moreover, by forming the voids above the nano-patterned structure, and through the distribution density of the voids and the refraction coefficient difference among the void, the coalesced semiconductor layer and the substrate, the subsequent epitaxial semiconductor layer to be coalesced may be further reduced and the defect density of the LED device may also be reduced. Furthermore, by sputtering the mask layer on the sidewalls of each mesa and the bottom surface of the recess, the subsequent epitaxial semiconductor layer may laterally grow from the top surface of each mesa of the nano-patterned structure, such that the areas being contacted between the coalesced semiconductor layer and the semiconductor layer having the nano-patterned structure may be reduced, thereby thinning the subsequent epitaxial semiconductor layer to be coalesced and lowering the defect density of the LED device. Thus, by employing any one of the afore-described techniques, the luminous intensity of the LED device in the disclosure can be drastically increased at the 222 nm-405 nm wavelength range, in particular, at ultraviolet wavelengths less than 365 nm.

Under a specific configuration of the active layer 230 in the LED device 200, that is, a layer number of doped quantum barrier layers or a thickness of the quantum barrier layers satisfies a certain relationship, an insertion of interlayer, or a portion of the quantum wells having at least one pair of light emitting layer and auxiliary layer, more electron-hole pairs can be distributed into the quantum wells 234 of the active layer 230, and thus the luminous intensity of the LED device 200 at the 222 nm-405 nm wavelength range can be further improved, together with the nano-patterned structure S in the carrier 210. With any one of the afore-described configurations of the active layer 230, more self-assembled indium-riched regions are foamed around the defects. Therefore, when carriers move to the defects, more carriers are captured by the self-assembled indium-riched regions, and thus increasing the carrier recombination rate.

The impact on the luminous intensity results from the various configurations of the active layer 230 in the LED device 200, which is further explained below. The afore-described carrier 210 (i.e., the nano-patterned structure S configured as shown in FIG. 4A, FIG. 4B or FIG. 4C) may be applied to the substrate such as SUB and SUBI in the following embodiments.

Embodiment I

In this embodiment, by having a number of quantum barrier layers of the active layer doped with n-type dopants, in which the layer number of the doped quantum barrier layers satisfies a specific relationship, or by having the lowest doping concentration at the quantum barrier layer doped with n-type dopants closest to the p-type semiconductor, or by having the doping concentrations of the quantum barrier layers doped with n-type dopants satisfying a specific relationship, the n-type dopants can compensate for the effect which defects have on the carriers. Accordingly, the carrier recombination rate of the LED device can be enhanced. Therefore, by employing any one of the afore-described techniques, the luminous efficiency of the LED device in the embodiment can be drastically increased at the 222 nm-405 mm wavelength range.

Figure 11A:
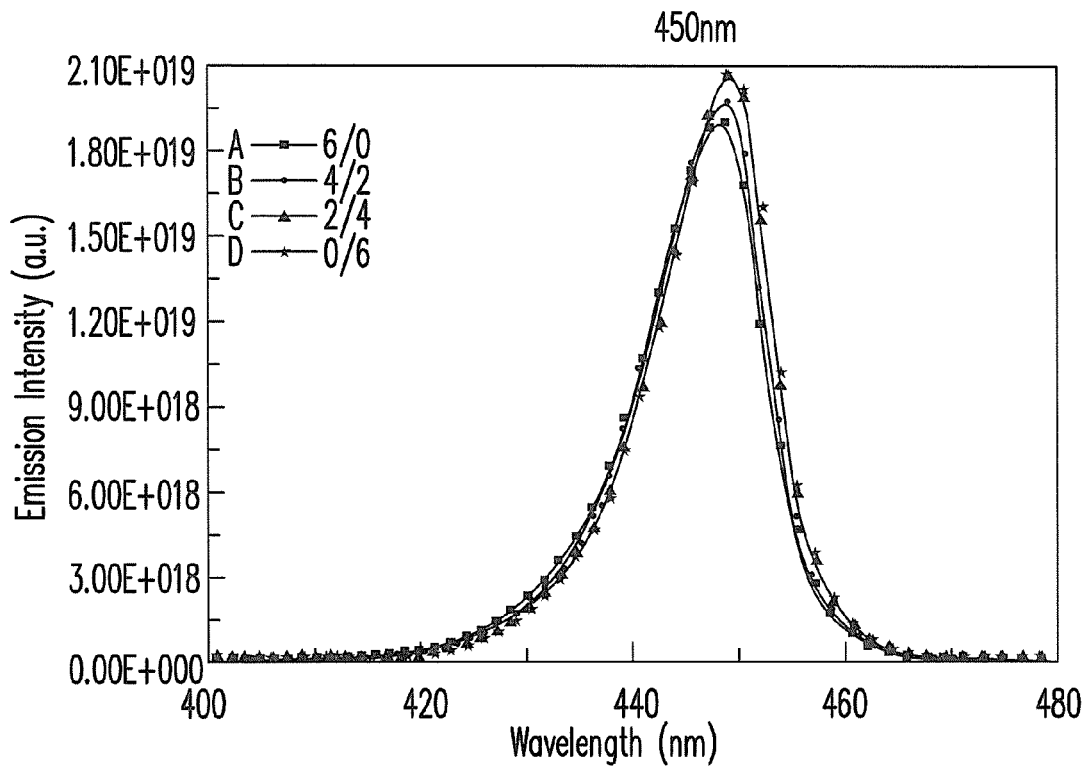
FIG. 11A is an optical simulation diagram of an LED device comparison example according to an exemplary embodiment.
Figure 11B:
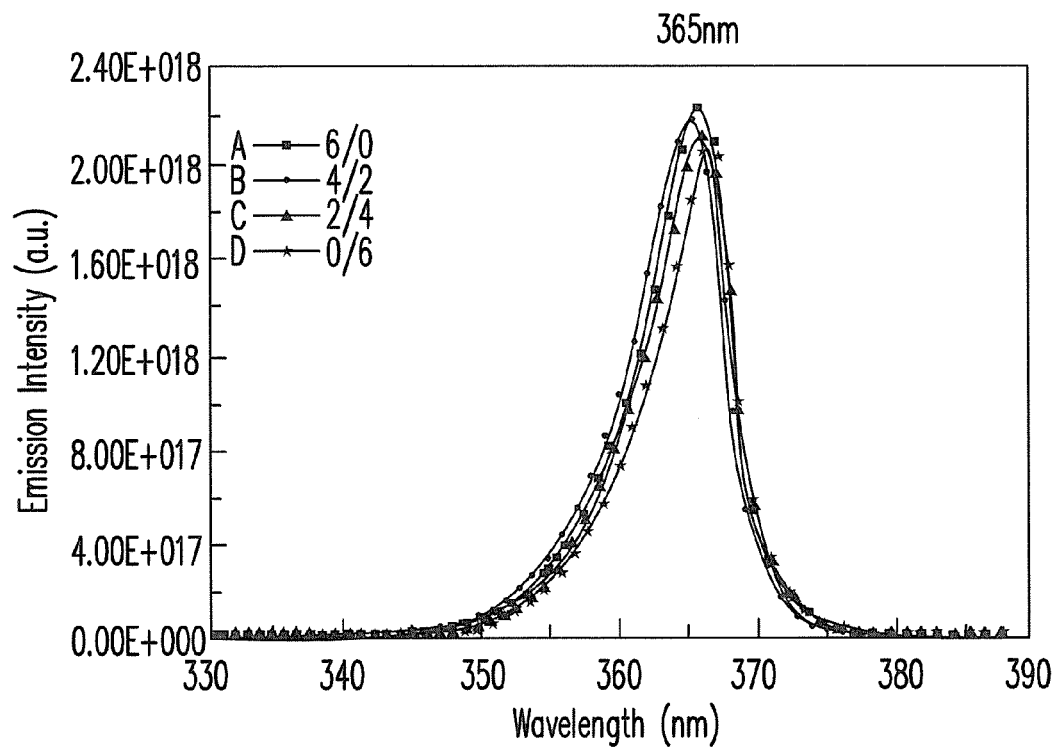
FIG. 11B is an optical simulation diagram of an LED device according to an exemplary embodiment.

FIG. 11A is an optical simulation diagram of an LED device comparison example according to an exemplary embodiment, and FIG. 11B is an optical simulation diagram of an LED device according to an exemplary embodiment, in which the defect density in FIGS. 11A and 11B is set as $1 \times 10^8/cm^3$. Please refer first to FIG. 11A, FIG. 11A is a relational diagram between adjustments to the layer number of doped quantum barrier layers in the quantum barrier layers 232a-232f and the emission intensities of an emission wavelength around 450 nm for an LED device according to an exemplary embodiment. Referring both to FIG. 3 and FIG. 11A, the horizontal axis represents the emission wavelength (unit: nm), and the vertical axis represents the emission intensity (unit: a.u.). Moreover, the numerals before and after the slanted line of the different lines A, B, C, and D respectively represents the layer numbers of doped/un-doped quantum barrier layers in the quantum barrier layers 232a-232f. The layer numbers of the doped layers are counted from the n-type semiconductor layer 220 side. For example, 6/0 in the line A represents all six of the quantum barrier layers 232a-232f are doped. 4/2 in the line B represents four quantum barrier layers 232a-232d near the n-type semiconductor layer 220 side are doped quantum barrier layers, and two layers are un-doped quantum barrier layers 232e-232f. 2/4 in the line C represents two quantum barrier layers 232a-232b near the n-type semiconductor layer 220 side are doped quantum barrier layers, and four layers are un-doped quantum barrier layers 232c-232f. On the other hand, 0/6 in the line D may represent all six of the quantum barrier layers 232a-232f are un-doped. As shown in FIG. 11A, the results show that increasing the layer number of doped quantum barrier layers instead decreases the luminous efficiency of the LED device around 450 nm.

By contrast, when the layer number of doped quantum barrier layers is increased, the emission intensity of the LED device at the 222 nm-405 nm wavelength range can be effectively enhanced. Specifically, FIG. 11B is a relational diagram between adjustments to the layer number of doped quantum barrier layers in the quantum barrier layers and the emission intensities of an emission wavelength around 365 nm. In FIG. 11B, the definitions of the horizontal axis, the vertical axis, and the lines are similar to FIG. 11A, in which FIG. 11B represents an emission wavelength range of 222 nm-405 nm having a main peak of around 365 nm. As shown in FIG. 11B, the results show that increasing the layer number of doped quantum barrier layers 232 promotes the enhancement of the luminous efficiency of the LED device at the 222 nm-405 nm wavelength range.

When the emission wavelength from the LED device is near 450 nm, it can inferred from the results presented in FIGS. 11A and 11B that, due to the comparatively strong localized effect in the quantum wells, the carriers are not easily influenced by the defect density. Therefore, doping the quantum barrier layers with n-type dopants cannot effectively enhance the emission intensity near 450 nm. On the other hand, too much doping results in the carrier overflow phenomenon and thus lowers the emission intensity, as shown in FIG. 11A. However, for the LED device having an emission wavelength around 365 nm, the effect of doping the quantum barrier layers with n-type dopants may have a completely inverse effect from the LED device emitting near 450 nm.

As shown in FIG. 11B, when the emission wavelength range of the LED device near the main peak of 365 nm is 222 nm-405 nm, due to the weakened localized effect in the quantum wells, the carriers experience comparatively stronger influence from the defect density, and therefore doping the available quantum barrier layers with n-type dopants (e.g. Si) helps compensate for the effect of the defect density on the carriers. In other words, the n-type dopants can also provide radiative recombination for the electrons, thereby effectively enhancing the luminous efficiency of the LED device at the 222 nm-405 nm emission wavelength range. The n-type dopants referred here in the embodiment may be dopants from group IV capable of replacing the group III elements and provided from an external source. As shown in FIG. 11B, the emission intensity of the emission wavelength range from 222 nm-405 nm increases as the layer number of the doped quantum barrier layers increases. The enhancement effect of the luminous efficiency is especially pronounced when a layer number k of the doped quantum barrier layers and a total number i of the quantum barrier layers satisfy the following formula: when i is an even number, $k \geq i/2$; and when i is an odd number, $k \geq (i-1)/2$.

Figure 12A:
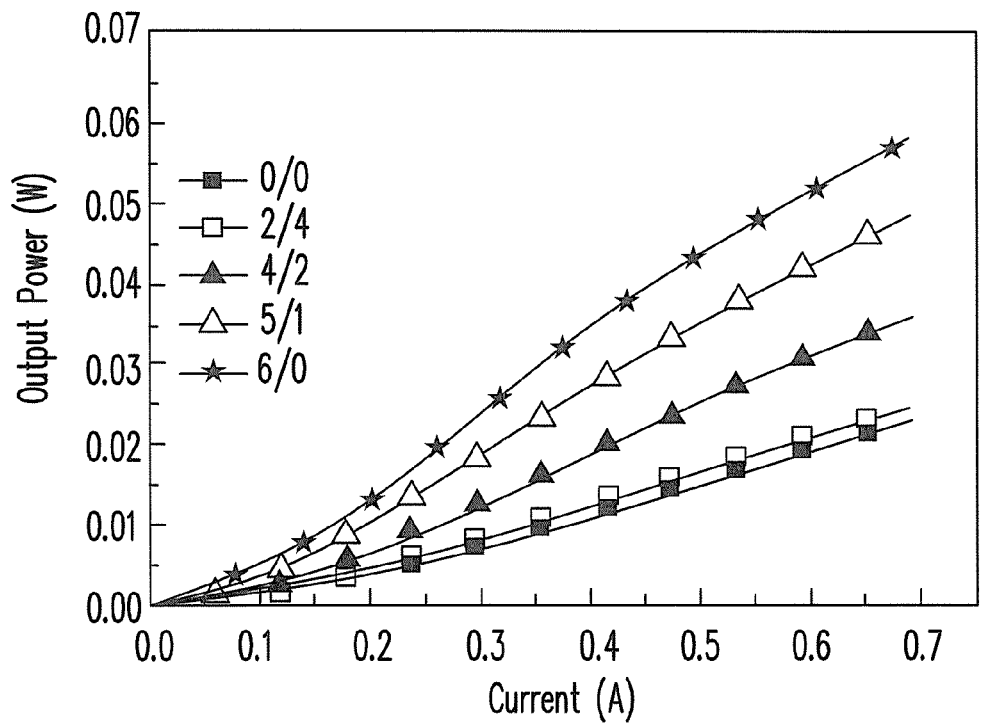
FIG. 12A is a relational diagram depicting the impact different number of doped layers in the quantum barrier layers of an LED device has on the current-output power curve.
Figure 12B:
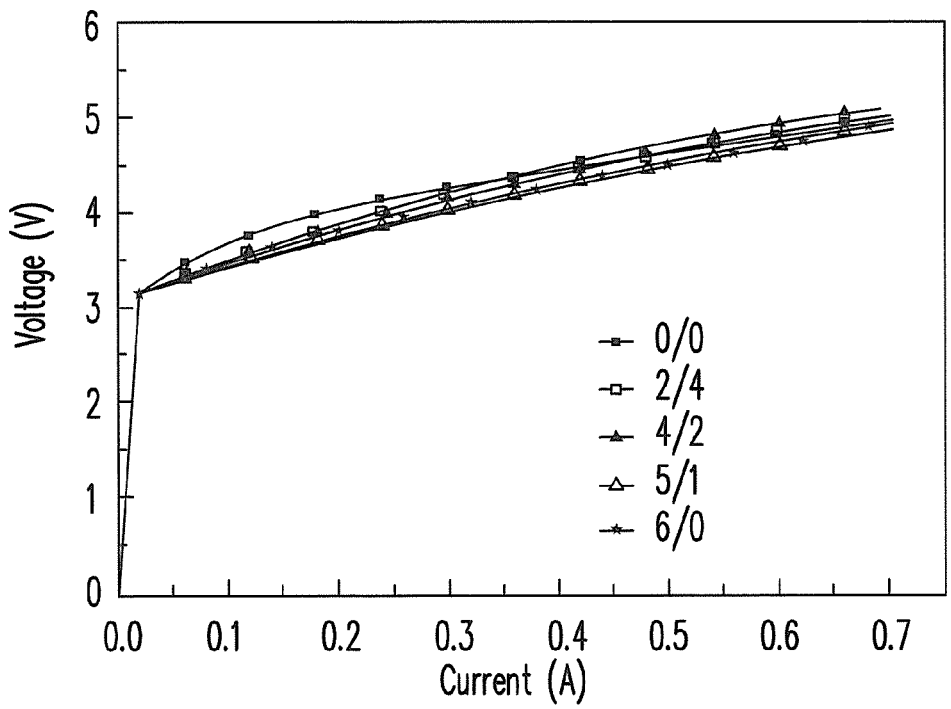
FIG. 12B is a relational diagram depicting the impact different number of doped layers in the quantum barrier layers of an LED device has on the current-voltage curve.

Table 2 records the emission intensity results under different currents of the LED device having the active layer structure shown in FIG. 3. Table 2 also records the forward voltages which change with the layer numbers of the doped quantum barrier layers and the un-doped quantum barrier layers. In the experiments tabulated in FIG. 1, the doping concentrations $C_1, C_2, \ldots C_k$ are $2 \times 10^{18}/cm^3$, for example. In an embodiment where the emission wavelength is 365 nm, a material of the quantum wells is $In_cGa_{1-c}N$, in which $0 \leq c \leq 0.05$, and a material of the quantum barrier layers is $Al_dGa_{1-d}N$, where d is between 0 to 0.25. In the present embodiment, a preferable aluminum concentration is 0.09-0.20, and a thickness of the quantum barrier layer is, for example, 5 nm-15 nm. The preferable thickness is 6 nm-11 nm in the present embodiment. Additionally, the results of Table 2 are illustrated in FIGS. 12A and 12B. FIG. 12A is a relational diagram depicting the impact different number of doped layers in the quantum barrier layers of an LED device has on the current-output power curve. FIG. 12B is a relational diagram depicting the impact different number of doped layers in the quantum barrier layers of an LED device has on the current-voltage curve.

TABLE 2

| LED device 200 | Total Quantum Barrier (QB) Layers i = 6 | | | Output Power (mW) | | Forward Voltage |
|---|---|---|---|---|---|---|
| | Doped QB Layers k | Un-Doped QB Layers | Doped Concentration | at 350 mA | at 700 mA | (V) at 350 mA |
| A | 0 | 6 | N.A. | 9.5 | 23.2 | 4.36 |
| B | 2 | 4 | $2 \times 10^{18}$ | 10.6 | 24.9 | 4.29 |
| C | 4 | 2 | | 17.0 | 36.3 | 4.27 |
| D | 5 | 1 | | 24.2 | 49.0 | 4.13 |
| E | 6 | 0 | | 31.1 | 58.4 | 4.14 |

As shown in the results of Table 2 and FIG. 12A, the output powers of the LED devices 200A-200E increase as the number of doped quantum barrier layers grow in the quantum barrier layers available. To be specific, firstly, when the quantum barrier layers are not doped with n-type dopants, the doping concentration thereof is 0, the GaN material has a background doping concentration that is different according to different epitaxial techniques or different epitaxy quality. In the present embodiment, since the background doping concentration cannot be measured, therefore the un-doped concentration is represented by N.A. At this time when six layers of quantum barrier layers are all un-doped with n-type dopants (e.g. Si), the output power is 9.5 mW (LED device 200A). When two layers in the six layers of quantum barrier layers are doped with n-type dopants (e.g., purposely doping the two quantum barrier layers 232a-232b in the quantum barrier layer 232a-232f depicted in FIG. 3 closest to the n-type semiconductor layer 220), the output power of the LED device 200B can be increased from the un-doped 9.5 mW to 10.6 mW. Preferably, when there are four doped quantum barrier layers 232 in the six quantum barrier layers 232 (e.g. purposely doping the four quantum barrier layers 232a-232d depicted in FIG. 3 closest to the n-type semiconductor layer 220), the output power of the LED device 200C can be drastically increased from the un-doped 9.5 mW to 17.0 mW, which is a twofold enhancement. Therefore, when the layer number k of the doped quantum barrier layers 232 is greater than or equal to half of the total number i of quantum barrier layers 232, the luminous efficiency of the LED device 200C can be effectively increased. Moreover, when five of the quantum barrier layers are doped, the output power of the LED device 200D is 24.2 mW. When all of the quantum barrier layers 232 are doped (e.g., purposely doping all six quantum barrier layers 232a-232f in FIG. 3), the output power of the LED device 200E can be increased to 31.1 mW, which is close to a threefold enhancement.

Furthermore, as shown by the results of Table 2 and FIG. 12B, by doping n-type dopants in the quantum barrier layers, other than effectively increasing the luminous efficiency of the LED device 200A, the resistance value of the quantum barrier layers can be further lowered, thereby reducing the forward voltage of the LED device. For example, a forward voltage of 4.36 V when all of the quantum barrier layers are un-doped is lowered to 4.14V when all of the quantum barrier layers are doped. The foregoing results represent that by increasing the number of doped layers in the quantum barrier layers, the effect defect density has on the luminous efficiency of the LED device at the 222 nm-405 nm wavelength range (main peak at around 365 nm) can be compensated.

Embodiment II

In this embodiment, through one of the three quantum barrier layers closest to the p-type semiconductor layer having a thickness greater than thicknesses of the other two quantum barrier layers, or the thickness of the quantum barrier layer in the active layer satisfying a certain relationship, electron-hole pairs may be evenly distributed into the active layer, the probability of electro-hole recombination may be increased, and luminous intensity of the LED device at the 222 nm-405 nm wavelength range can be significantly improved.

According to the present embodiment, it is assumed that the active layer 230 of the LED device 200 has the structure shown in FIG. 3, and the current of 300 mA and the current of 700 mA are applied. On these conditions, when the thicknesses of the quantum barrier layers 232a-232f (unit: nm) at different locations are changed, the luminous intensity of the LED device 200 is provided in Table 3. Herein, the thickness of each of the quantum wells 234a-234e is 3 nm. Besides, in the present embodiment, the quantum wells 234a-234e are made of $In_cGa_{1-c}N$, for instance, and $0 \leq c \leq 0.05$; the quantum barrier layers 232a-232f are made of $Al_dGa_{1-d}N$, for instance, and $0 \leq d \leq 0.25$ (preferably $0.09 \leq d \leq 0.20$).

Namely, according to the present embodiment, the active layer 230 has six quantum barrier layers 232a-232f, as indicated in FIG. 3. A thickness of each of the six quantum barrier layers 232a-232f, counting from the p-type semiconductor layer 240, is $T_1$, $T_2$, $T_3$ . . . , and $T_i$ in sequence (i=6 in the present embodiment). Namely, $T_1$ represents the thickness of the quantum barrier layer 232f closest to the p-type semiconductor layer 240, and $T_6$ represents the thickness of the quantum barrier layer 232a closest to the n-type semiconductor layer 220.

TABLE 3

| LED | $T_6$ | $T_5$ | $T_4$ | $T_3$ | $T_2$ | $T_1$ | Luminous intensity at 350 mA | Luminous intensity at 700 mA |
|---|---|---|---|---|---|---|---|---|
| I | 9 | 9 | 9 | 9 | 9 | 11 | 17.0 | 36.3 |
| II | 9 | 9 | 9 | 6 | 6 | 6 | 5.9 | 17.3 |
| III | 9 | 9 | 6 | 6 | 9 | 11 | 24.0 | 45.7 |
| IV | 6 | 6 | 6 | 6 | 9 | 11 | 30.3 | 59.0 |
| V | 3 | 3 | 5 | 7 | 9 | 11 | 33.1 | 61.6 |

As shown in Table 3, the LED device I has the luminous intensity of 17.0 mW when the current of 350 mA is applied. With reference to FIG. 3 and Table 3, among the three quantum barrier layers 232d-232f close to the p-type semiconductor layer 240 in the LED device 200, when the thickness $T_1$ of the quantum barrier layer 232f closest to the p-type semiconductor layer 240 is greater than the thicknesses $T_2$ and $T_3$ of the quantum barrier layers 232e and 232d relatively close to the n-type semiconductor layer 220 (i.e., when $T_1$ is greater than $T_2$ and greater than $T_3$), the luminous intensity of the LED device 200 can be effectively improved.

Specifically, compared to the luminous intensity of the LED device I, the luminous intensity of the LED device II is significantly reduced to 5.9 mW. Since the thickness $T_1$ of the quantum barrier layer 232f closest to the p-type semiconductor layer 240 in the LED device II is relatively small, the electrons may not be effectively confined in the quantum well, and the luminous intensity of the LED device II is lessened to a great extent. This complies with the mechanism described in the previous embodiments.

Compared to the thicknesses $T_3$ and $T_4$ of the intermediate quantum barrier layers 232d and 232c in the LED device I, the thicknesses $T_3$ and $T_4$ of the intermediate quantum barrier layers 232d and 232c in the LED device III are reduced, and the luminous intensity of the LED device III can then be raised to 24 mW. With said thickness design, the holes can be easily injected to the more quantum wells 234a-234e toward the n-type semiconductor layer 220 relative to the LED device I. In the LED device IV, the thicknesses of the quantum barrier layers 232b and 232a are further reduced, and the light output power is drastically raised to 30.3 mW.

In the LED device V, the thicknesses $T_1$-$T_6$ of the quantum barrier layers 232f-232a gradually decrease if counting from the p-type semiconductor layer 240 to the n-type semiconductor layer 220. As indicated in Table 3, together with the gradual reduction of thicknesses from $T_1$ to $T_6$, the luminous intensity is gradually doubled to about 33.1 mW. Namely, the thicknesses $T_1$-$T_3$ of the three quantum barrier layers 232 closest to the p-type semiconductor layer 240 in the LED device satisfy $T_1 \geq T_2$ and $T_1 \geq T_3$, such that holes may be evenly distributed into the quantum wells of the active layer, and that electron overflow can be suppressed. Thereby, the luminous intensity of the LED device can be effectively enhanced.

Figure 13:
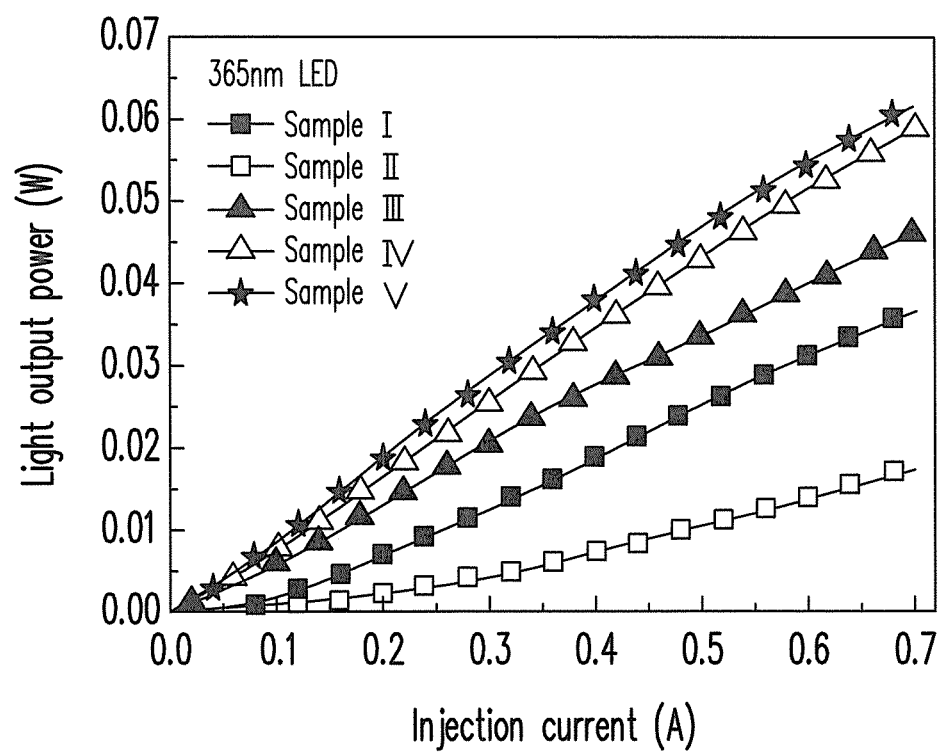
FIG. 13 illustrates light output power-injection current curves of the LED devices provided in Table 3.

FIG. 13 illustrates light output power-injection current curves of the LED devices provided in Table 3. It can be learned from Table 3 and FIG. 13 that the light output power of the LED device can be improved by adjusting the thicknesses of the quantum barrier layers 232f-232a in the active layer 230. Specifically, since the three quantum barrier layers 232f-232d close to the p-type semiconductor layer 240 affect the hole mobility to a greater extent than the other quantum barrier layers 232c-232a, the luminous intensity can be effectively enhanced by adjusting the thicknesses of the quantum barrier layers 232f-232d.

Among the i quantum barrier layers 232 in the active layer 230, if, compared to the thicknesses $T_2$-$T_1$, the thickness $T_1$ has the greatest value, the luminous intensity of the LED device can be ameliorated.

According to Table 3, the thicknesses (e.g., $T_3$ and $T_4$) of the intermediate quantum barrier layers may be smaller than the thicknesses of the quantum barrier layers close to the n-type semiconductor layer 220 and the p-type semiconductor layer 240 in the LED device (e.g., the LED device III), and the light output power can be improved in an effective manner. The thicknesses of the quantum barrier layers 232b and 232a close to the n-type semiconductor layer 220 may be designed to be smaller than the thicknesses of the quantum barrier layers 232f and 232e close to the p-type semiconductor layer 240, such that the thicknesses of the quantum barrier layers 232d-232a are equal. As such, the light output power of the LED device (e.g., the LED device IV) can be further enhanced. Note that the luminous intensity of the LED device (e.g., the LED device V in which the thicknesses of the quantum barrier layers 232 gradually decrease if counting from the p-type semiconductor layer 240 to the n-type semiconductor layer 220) has the greatest value in comparison with the luminous intensity of the LED devices I~IV.

According to the experimental results described above, it can be deduced that the light emitting efficiency of the LED device can be effectively ameliorated by evenly distributing the electron-hole pairs into the quantum wells of the active layer 230 and by enhancing the carrier confinement effects of the quantum barrier layers close to the p-type semiconductor layer 240.

Taking the six quantum barrier layers 232 described in the above experiments as an example, the thickness $T_1$ of the first quantum barrier layer 232f closest to the p-type semiconductor layer 240 has the greatest value, and the thickness $T_2$ of the second quantum barrier layer 232e is smaller than or equal to the thickness $T_1$ of the first quantum barrier layer 232f. Thereby, the first quantum well closest to the p-type semiconductor layer 240 can achieve the confinement effects to a better extent, electron overflow can be prevented, and radiative recombination of electrons and holes can be accomplished.

In view of the above experiments and inference, the thickness $T_1$ of the first quantum barrier layer 232f closest to the p-type semiconductor layer 240 has the greatest value; thereby, electron overflow can be prevented, and radiative recombination of electrons and holes can be more efficient. Hence, people skilled in the art should be aware that the first quantum well closest to the p-type semiconductor layer 240 can have favorable confinement effects when the thickness $T_2$ of the second quantum barrier layer 232e is equal to the thickness $T_1$ of the first quantum barrier layer 232f. As such, electron overflow can still be prevented, and radiative recombination of electrons and holes can still be accomplished.

To be more specific, compared to the thicknesses $T_1$ and $T_2$, the thickness $T_3$ of the third quantum barrier layer 232d has the least value within the thicknesses $T_1$ to $T_3$ (see the LED devices III~V in Table 3). This is conducive to hole injection, i.e., the holes can be effectively injected into the quantum wells 234 toward the n-type semiconductor layer 220, and the holes can be evenly distributed into the active layer 230. As shown in Table 3, when $T_1 > T_2 = T_3$, the light output power of the LED device I can be greater than the LED device II. When the thickness $T_i$ (i=6 in the present embodiment) of the quantum barrier layer closest to the n-type semiconductor layer has the smallest value, the LED devices IV and V shown in Table 3 have favorable luminous intensity, given that the current of 350 mA and the current of 700 mA are applied. That is, when the thickness $T_i$ of the quantum barrier layer closest to the n-type semiconductor layer has the least value among the thicknesses of i quantum barrier layers, the light output power can be effectively enhanced.

Embodiment III

Figure 14:
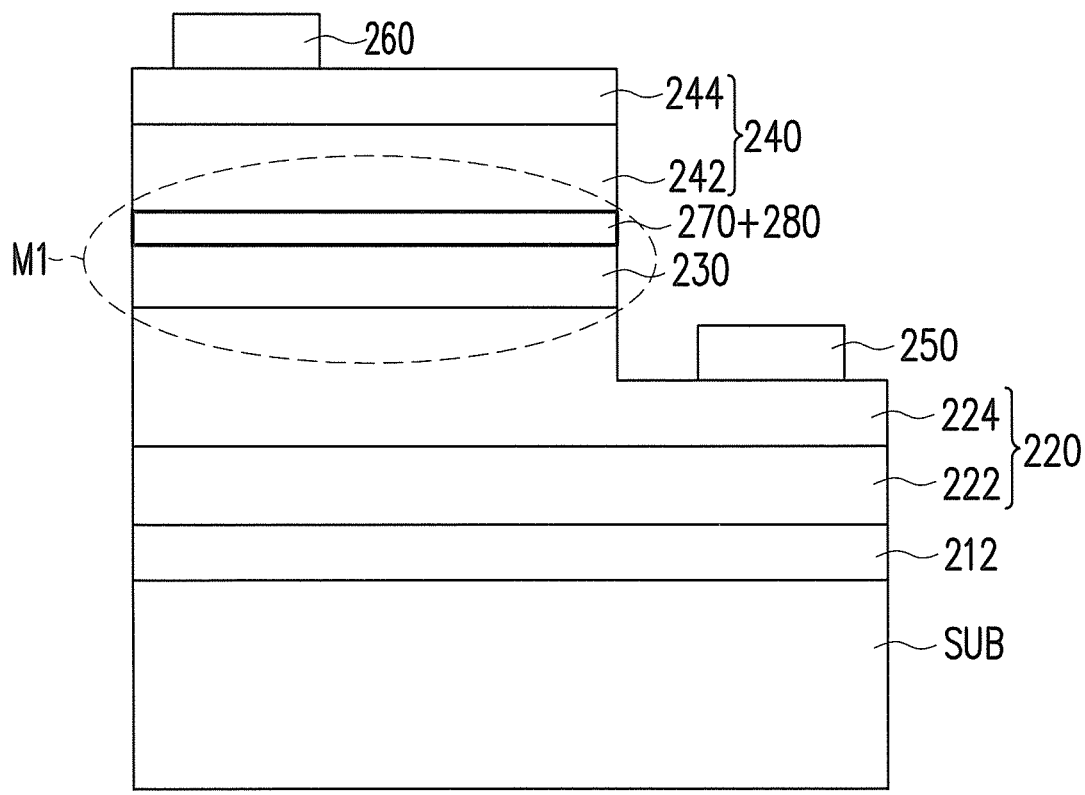
FIG. 14 is a schematic cross-sectional diagram illustrating an LED device according to an exemplary embodiment.
Figure 15:
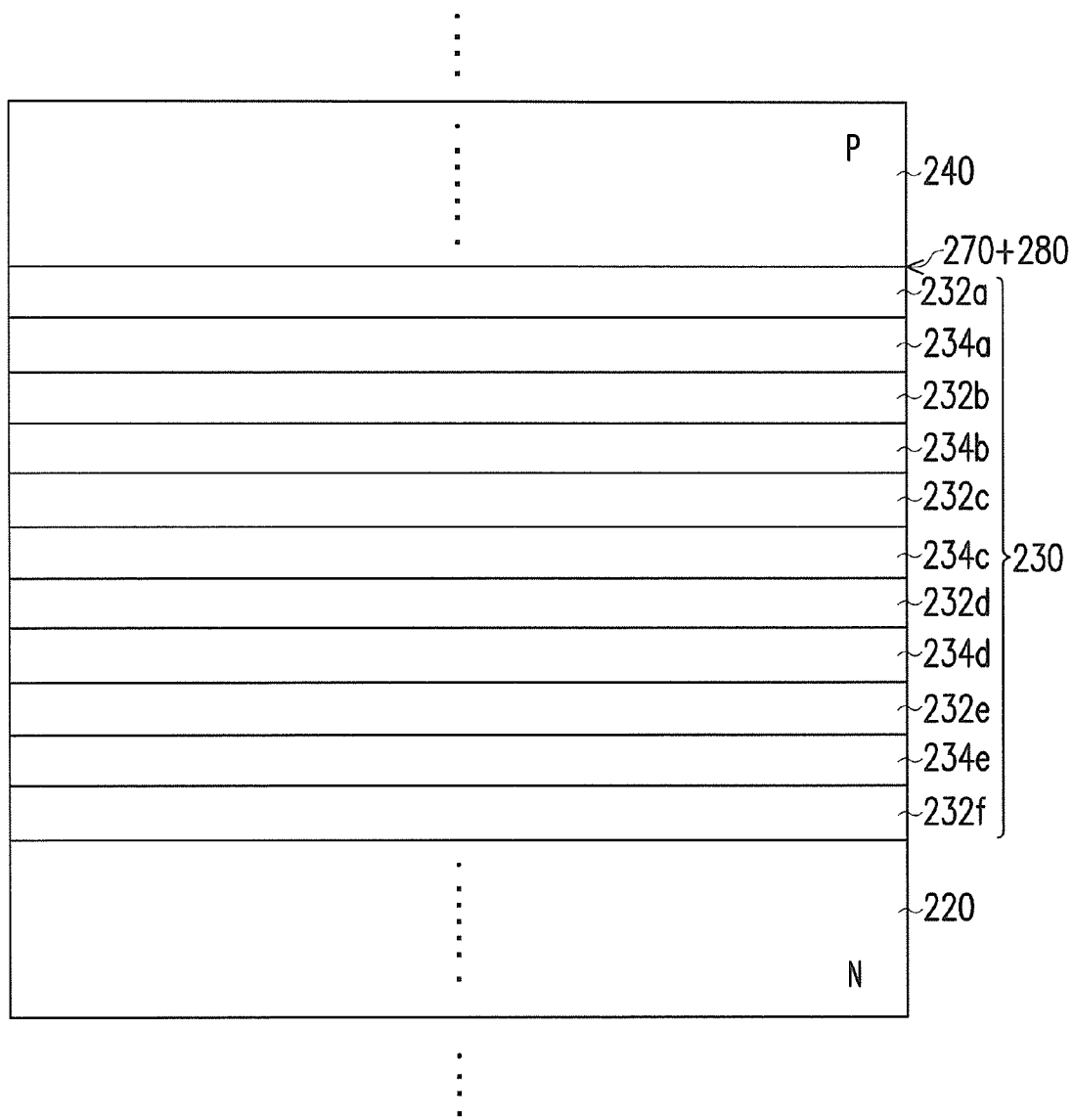
FIG. 15 is an enlarged schematic cross-sectional diagram illustrating an active layer in the LED device depicted in FIG. 14.

FIG. 14 is a schematic cross-sectional diagram illustrating an LED device according to an exemplary embodiment. The structure of the LED device 300 depicted in FIG. 14 is similar to the LED device 200 depicted in FIG. 1, except that an electron barrier layer 270 and an interlayer 280 are located between the active layer 230 and the p-type semiconductor layer 240. FIG. 15 is an enlarged schematic cross-sectional diagram illustrating an active layer in the LED device depicted in FIG. 14. The structure of the active layer 230 depicted in FIG. 15 is similar to the structure of the active layer 230 depicted in FIG. 3, except that the quantum barrier layers 232a-232f, counting from the p-type semiconductor layer 240, are sequentially 232a, 232b, 232c, 232d, 232e and 232f, and the quantum wells 234a-234e, counting from the p-type semiconductor layer 240, are sequentially 234a, 234b, 234c, 234d and 234e, and the electron barrier layer 270 and the interlayer 280 are located between the quantum barrier layer 232a and the p-type semiconductor layer 240.

In this embodiment, in order to reduce the mismatch phenomenon of the polarization field due to the difference in the lattice constants between the electron barrier layer and the quantum barrier layer closest to the p-type semiconductor layer, and to improve the electron confinement effects and reduce electron overflow, the electron barrier layer 270 adjacent to the p-type semiconductor layer 240 is inserted between the active layer 230 and the p-type semiconductor layer 240. The interlayer 280 is inserted between the electron barrier layer 270 and the quantum barrier layer 232 closest to the p-type semiconductor layer 240 in the active layer 230 (as shown in FIG. 15, the quantum barrier layer closest to the p-type semiconductor layer 240 in the active layer 230 is labelled as 232a hereafter), such that the two surfaces of the interlayer 280 are in contact with the quantum barrier layer 232a and the electron barrier layer 270. By employing any one of the afore-described techniques such as varying the lattice constant or the thickness of the interlayer 280, the lattice constant $a_2$ of the interlayer 280 may satisfy the specific relationship with the lattice constant $a_1$ of the quantum barrier layer 232a or the lattice constant $a_3$ of the electron barrier layer 270, so as to control the energy bands of the conductive band and the valence band of the quantum barrier layer closest to the p-type semiconductor layer 240 in the active layer 230 connected to the electron barrier layer 270. Alternatively, by having the thickness $t_2$ of the interlayer 280 to satisfy the specific relationship with the thickness $t_3$ of the electron barrier layer 270, the energy bands of the conductive band and the valence band of the quantum barrier layer closest to the p-type semiconductor layer 240 in the active layer 230 connected to the electron barrier layer 270 may also be controlled so as to improve the hole injection efficiency, thereby enhancing the overall luminous efficiency of the LED device 300.

Specifically, the lattice constants described in the embodiment may be defined as average lattice constants, and the lattice constant formula, $Al_aIn_bGa_{1-a-b}N$, the lattice constants may be calculated as $3.112 \times a + 3.544 \times b + 3.1892 \times (1-a-b)$. In the case of b=0, when the aluminum concentration, a, is equal to 0.08, the corresponding lattice constant is 3.1830 Å. When the structure comprises multiple layers, such as $Al_cIn_dGa_{1-c-d}N$ having the thickness $t_1$ and $Al_eIn_fGa_{1-e-f}N$ having the thickness $t_2$, the lattice constants corresponding to $Al_cIn_dGa_{1-c-d}N$ and $Al_eIn_fGa_{1-e-f}N$ are $a_1$ and $a_2$, and the average lattice constant for such structure is:

$$\frac{(a_1 \times t_1 + a_2 \times t_2)}{t_1 + t_2}.$$

Specifically, when the electron barrier layer 270 is inserted between the active layer 230 and the p-type semiconductor layer 240, the carrier confinement effects in the LED device may be improved so as to enhance the luminous efficiency of the LED device. Moreover, in the embodiment, the interlayer 280 is inserted between the electron barrier layer 270 and the quantum barrier layer closest to the p-type semiconductor layer 240. In an embodiment, the interlayer 280 may be in the form of graded interlayer. In another embodiment, the interlayer 280 may be in the form of polarization field reversal interlayer. Specifically, by varying the lattice constant or/and thickness of the interlayer 280, the energy bands of the conductive band and the valence band of the quantum barrier layer closest to the p-type semiconductor layer 240 in the active layer 230 connected to the electron barrier layer 270 may be effectively controlled to prevent the mismatch phenomenon of the polarization field that is caused by the difference in the lattice constants between the electron barrier layer and the quantum barrier layer closest to the p-type semiconductor layer, such that the conductive band energy level is higher than the Fermi energy level, thereby improving the electron confinement effects and reducing electron overflow. Moreover, the energy band discontinuity between the electron barrier layer and the quantum barrier layer closest to the p-type semiconductor layer may be removed from the valence band, thereby facilitating the hole injection and enhancing the luminous efficiency effectively. Particularly, the enhancement effect is especially pronounced for the emitted light from the active layer 230 having a wavelength range from 222 nm to 405 nm.

Figure 16A:
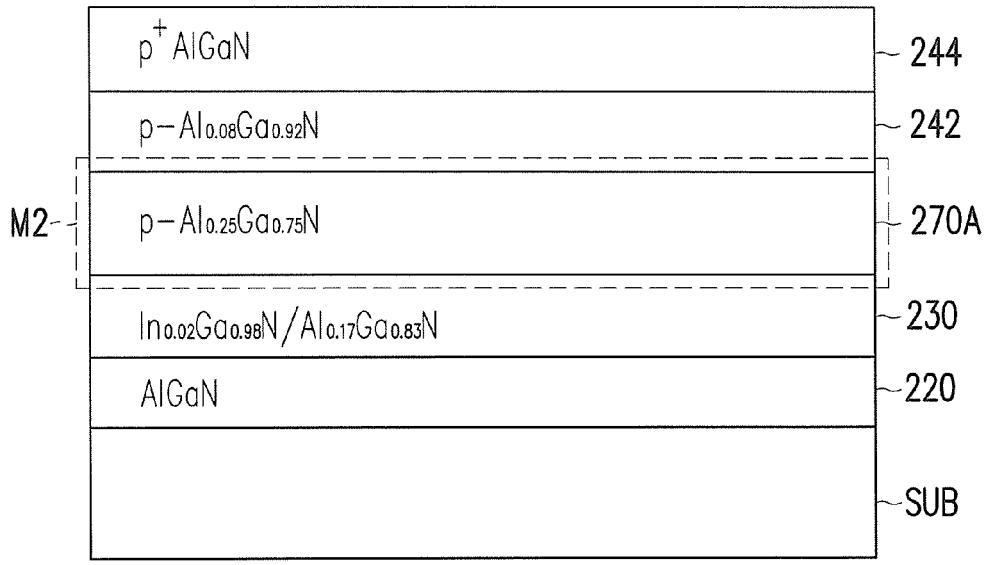
FIG. 16A to FIG. 16D respectively are schematic diagrams illustrating structure pattern of the LED devices according to a first exemplary embodiment.
Figure 16B:
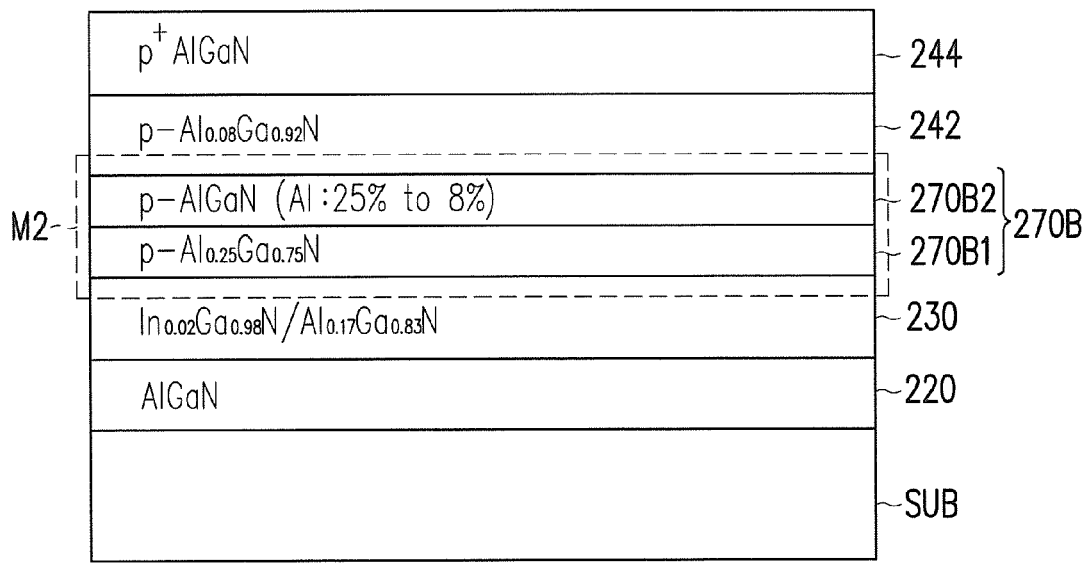
Figure 16C:
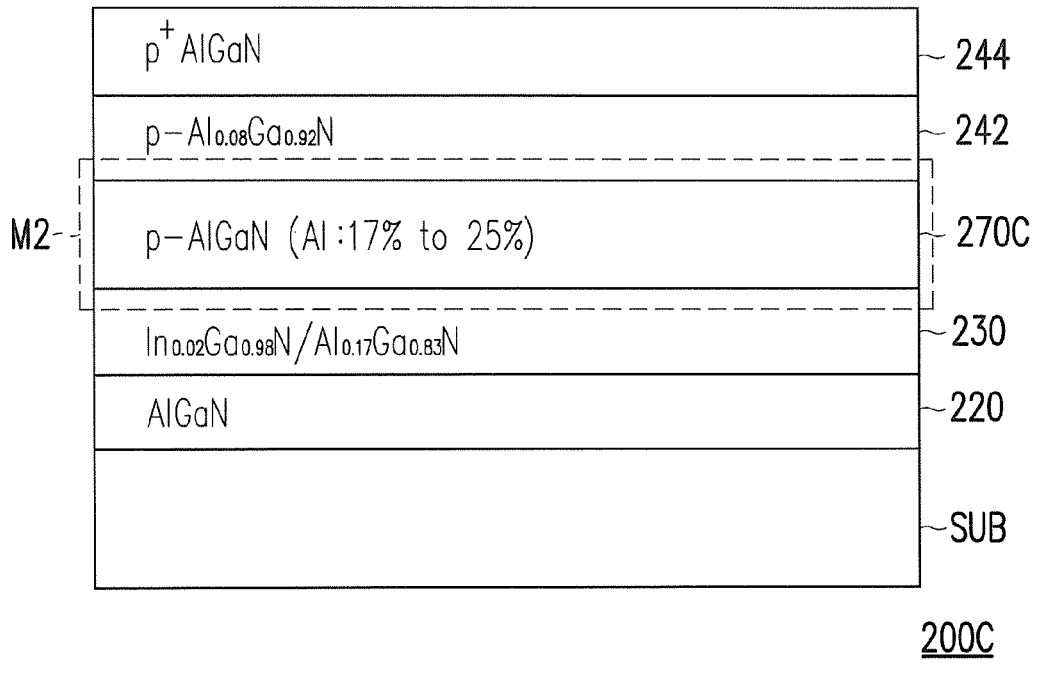

FIG. 16A to FIG. 16D respectively are schematic diagrams illustrating structure pattern of the LED devices according to a first exemplary embodiment, in which FIG. 1D is the structure of an LED device according to the first exemplary embodiment, and FIG. 16A to FIG. 16C serve as the comparative examples for the LED device in the first exemplary embodiment. The details of layer structure in the LED devices 200A-200D depicted in FIG. 16A to FIG. 16D are clearly illustrated in the structures depicted in FIG. 14, and thus a brief description of the relative locations among a portion of the layers and the material of each layer, is illustrated in FIG. 16A to FIG. 16D. Each layer material depicted in FIG. 16A to FIG. 16D is represented by the elementary composition, for instance, the material of the first p-type doped AlGaN layer 242 in the LED devices 200A-200D is $Al_{0.08}Ga_{0.92}N$, the material of the quantum barrier layers in the active layer 230 is $Al_aGa_{1-a}N$, and the material of the quantum wells is $In_cGa_{1-c}N$. Moreover, the material of the second p-type doped AlGaN layer 244 and the n-type semiconductor layer 220 are, for instance, $P^+$ AlGaN and AlGaN, respectively. Referring to FIG. 16A to FIG. 16D, the difference among the LED devices 200A-200D is the sandwich structure between the first p-type doped AlGaN layer 242 and the active layer 230, which is the layer structure and the elements indicated at M2 in FIG. 16A to FIG. 16D.

Figure 16D:
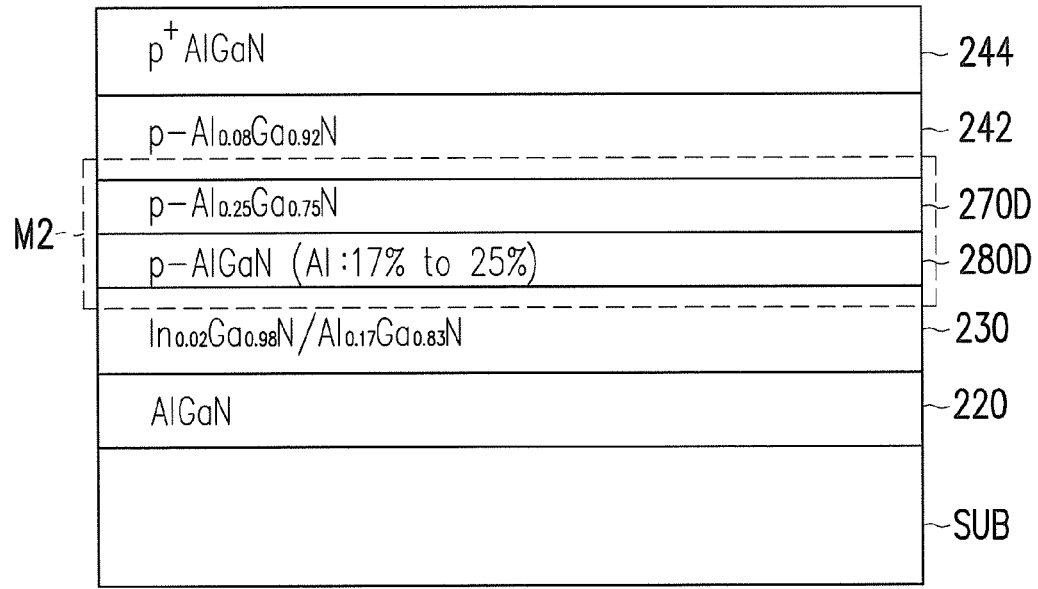
Figure 17A:
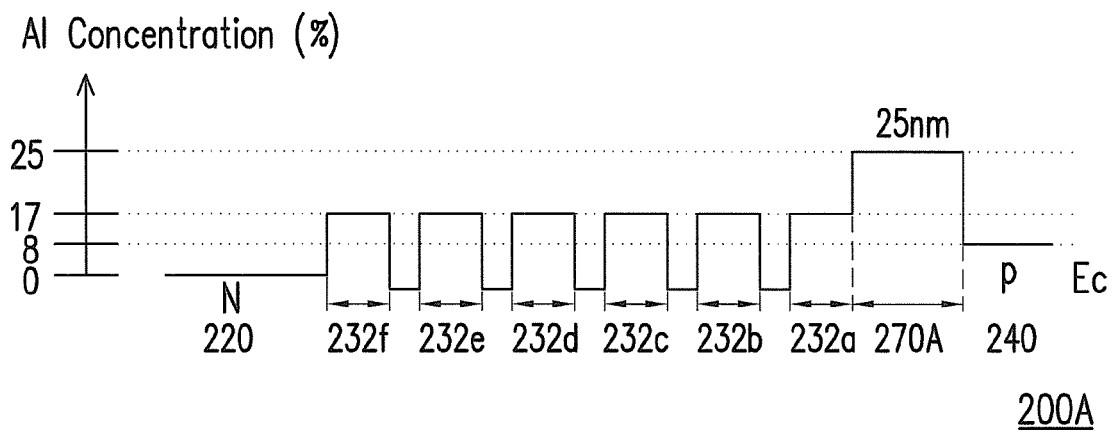
FIG. 17A to FIG. 17D respectively are schematic diagrams illustrating energy band level for several LED devices of the devices depicted in FIG. 16A to FIG. 16D.
Figure 17B:
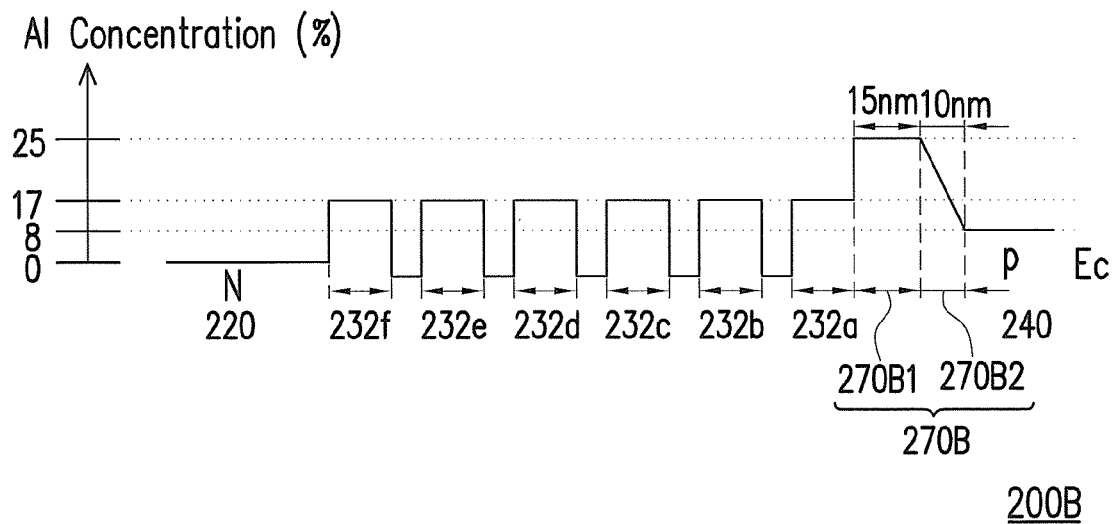
Figure 17C:
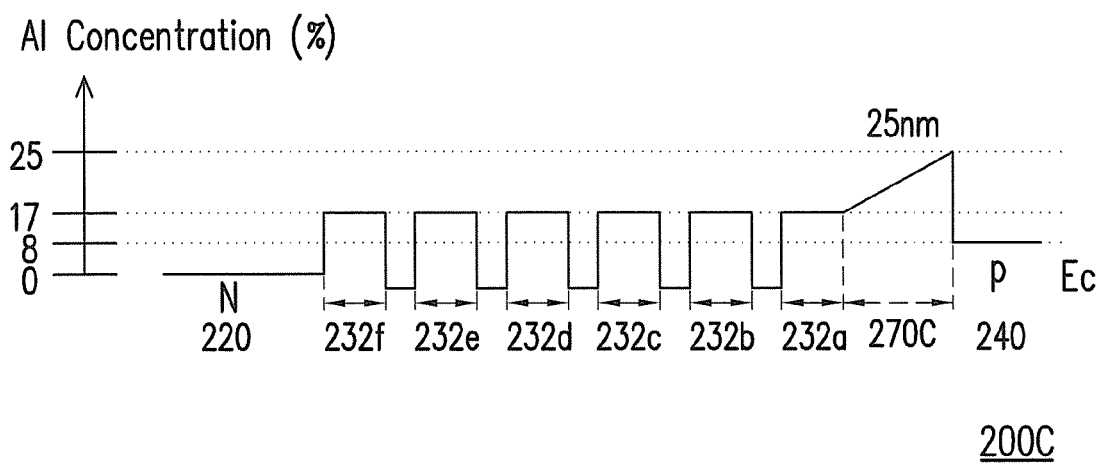
Figure 17D:
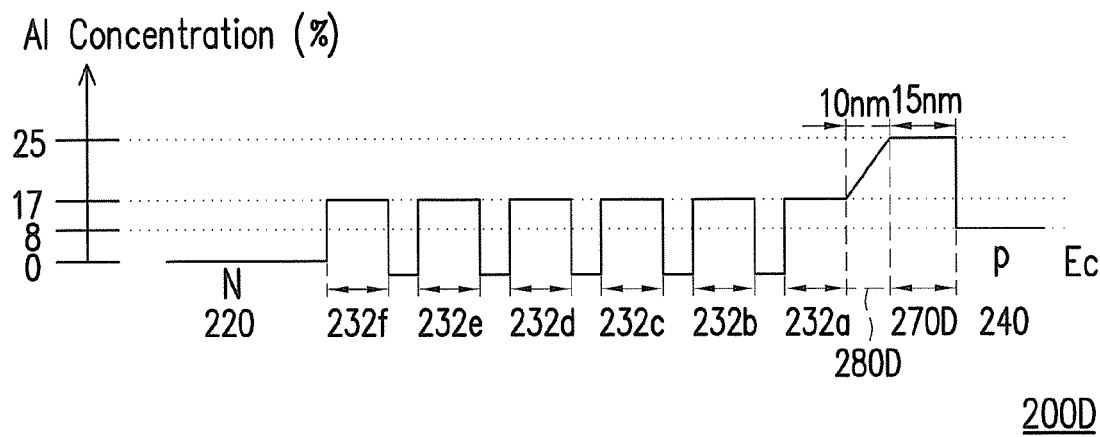

FIG. 17A to FIG. 17D respectively are schematic diagrams illustrating energy band level for several LED devices of the devices depicted in FIG. 16A to FIG. 16D. Same as the afore-described LED devices 200A-200C depicted in FIG. 16A to FIG. 16C, FIG. 17A to FIG. 17C are comparative examples, and FIG. 17D is the LED device for the first exemplary embodiment. The horizontal axis represents the relative location (thickness) of the stacked layers in each of the LED devices 200A-200D, and the vertical axis represents the aluminum concentration of each layer. The thickness (unit: nm) of each layer is labelled above each layer. Moreover, in the first exemplary embodiment, the description is based on the interlayer 280 belonging to the graded interlayer type.

Referring to FIG. 16A and FIG. 17A, in the LED device 200A, the electron barrier layer 270A is a $Al_{0.25}Ga_{0.75}N$ film having a fixed aluminum concentration of 25% and a thickness of 25 nm, while the layer structures sandwiched between the p-type semiconductor layer 240 and the active layer 230, such as the electron barrier layer 270, in the LED device 200B of FIG. 16B, the LED device 200C of FIG. 16C and the LED device 200D of FIG. 16D, are divided into the structure having various aluminum concentrations.

More specifically, referring to FIG. 16B and FIG. 17B, in the LED device 200B, after the growth of the quantum barrier layer closest to the p-type semiconductor layer 240 (as shown in FIG. 15), the electron barrier layer 270B1 having a fixed aluminum concentration of 25% and a thickness of 15 nm is subsequently grown, and then the electron barrier layer 270B2 having the aluminum concentration from 25% gradually reduced to 8% is grown and in contact with the p-$Al_{0.08}Ga_{0.92}N$ layer (i.e., the first p-type doped AlGaN layer 242).

Referring to FIG. 16C and FIG. 17C, in the LED device 200C, after the growth of the quantum barrier layer closest to the p-type semiconductor layer 240, the electron barrier layer 270C having an aluminum concentration gradually increased from 17% to 25% and a thickness of 25 nm is grown. Referring to FIG. 16D and FIG. 17D, in the LED device 200D of the first exemplary embodiment, after the growth of the quantum barrier layer closest to the p-type semiconductor layer 240, the interlayer 280D having an aluminum concentration gradually increased from 17% to 25% and a thickness of 25 nm is subsequently grown, and then the electron barrier layer 270D having a fixed aluminum concentration of 25% and a thickness of 15 nm is grown.

Figure 18A:
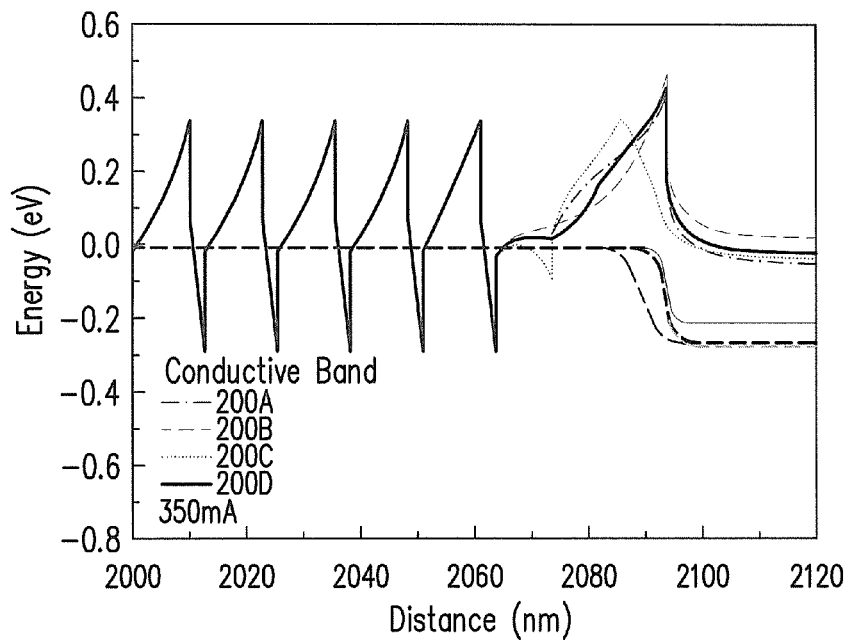
FIG. 18A and FIG. 18B respectively are simulation diagrams illustrating conductive bands and valence bands of the LED devices depicted in FIG. 16A to FIG. 16D when a current of 350 mA is applied.
Figure 18B:
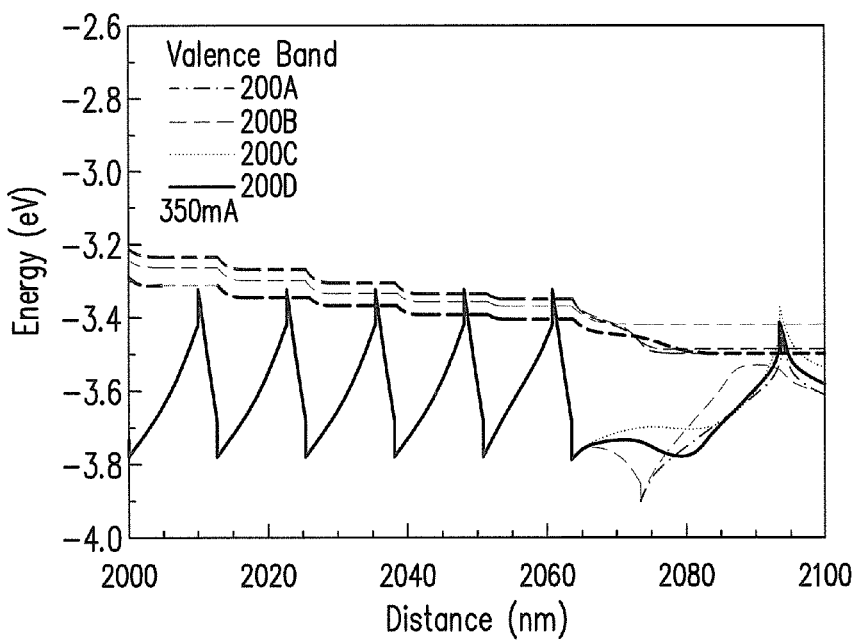

FIG. 18A and FIG. 18B respectively are simulation diagrams illustrating conductive bands and valence bands of the LED devices depicted in FIG. 16A to FIG. 16D when a current of 350 mA is applied. It can seen from FIG. 18A and FIG. 18B that, by having the interlayer 280D inserted into the structure of the LED device 200D, the energy bands of the conductive band and the valence band for connecting the electron barrier layer and the quantum barrier layer closest to the p-type semiconductor layer may be varied. Specifically, as shown in FIG. 18A, the conductive band energy levels of the interlayer 280D in the LED device 200D are higher than the Fermi energy level, which indicates the layer structure of the LED device 200D may increase the electron confinement effects and reduce electron overflow. Additionally, as shown in FIG. 18B, the energy band discontinuity between the electron barrier layer and the quantum barrier layer closest to the p-type semiconductor layer may be removed due to the valence band of the interlayer 280D in the LED device 200D, so as to facilitate the hole injection effectively.

Figure 19:
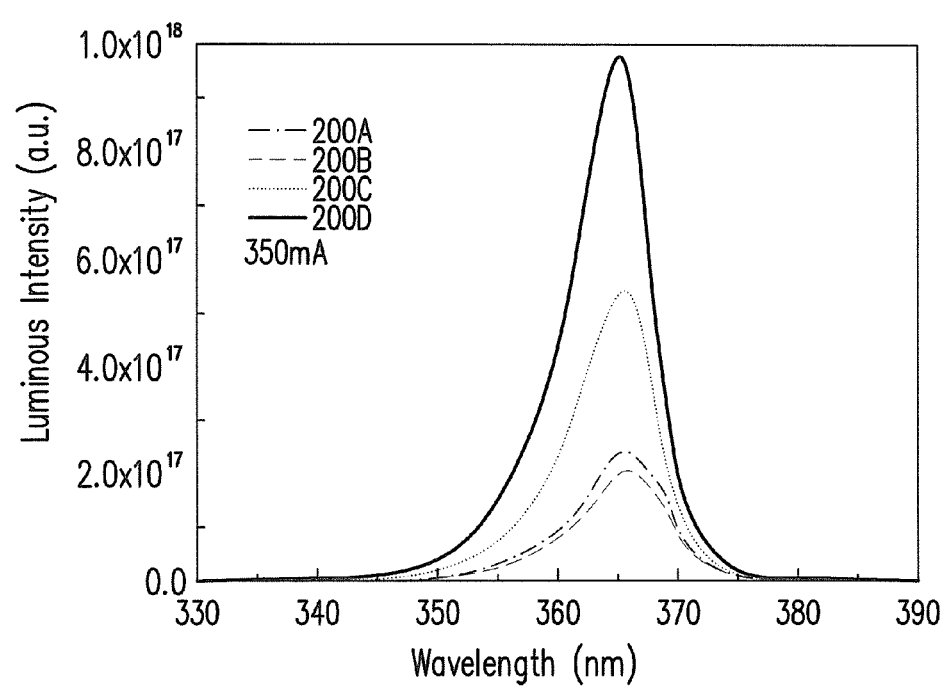
FIG. 19 is a simulation diagram illustrating luminous intensity of the LED devices depicted in FIG. 16A to FIG. 16D.

Further, FIG. 19 is a simulation diagram illustrating luminous intensity of the LED devices depicted in FIG. 16A to FIG. 16D. From FIG. 19, the LED device 200D in the first exemplary embodiment has the highest luminous intensity.

Similarly, by having the thickness $t_2$ of the interlayer and the thickness $t_3$ of the electron barrier layer to satisfy the specific relationship, i.e, $t_2 \leq 0.9 t_3$, and under the condition that the thickness $t_3$ is thick enough, electrons may be prevented to tunnel through the electron barrier layer, from the quantum barrier layer closest to the p-type semiconductor layer to the p-type semiconductor layer. Thus, the electron confinement effects are improved, thereby enhancing the afore-described effects.

The aforementioned inferences are further illustrated with support from the experimental results described below. Table 4 records the luminous intensity and the forward turn-on voltage that result under different currents (i.e., the currents of 350 mA and 700 mA are applied) of the LED devices 200A, 200B and 200D, when the structures between the electron barrier layer and the quantum barrier layer closest to the p-type semiconductor layer in the active layer are varied in the LED devices 200A, 200B and 200D as shown in FIG. 16A, FIG. 16B and FIG. 16D. Herein, in the present embodiment, the active layer 230 includes five quantum wells 234, and the thickness of each of the quantum wells 234a-234e is 3 nm.

TABLE 4

| LED device | Interlayer 280 | | Electron Barrier Layer 270 | | Luminous Intensity at 350 mA (mW) | Luminous Intensity at 700 mA (mW) | Forward Turn-on Voltage at 350 mA (V) |
|---|---|---|---|---|---|---|---|
| | Thickness $t_2$ (nm) | Aluminum Concentration (%) | Thickness $t_3$ (nm) | Aluminum Concentration (%) | | | |
| 200A | — | — | 25 | | 33.1 | 61.6 | 4.28 |
| 200B | — | — | 15 | 25% | 24.5 | 43.3 | 4.13 |
| | | | 10 | 25% to 8% | | | |
| 200D | 10 | 17% to 25% | 15 | 25% | 54.0 | 91.8 | 4.17 |

As shown in Table 4 and FIG. 16A, the LED device 200A has the luminous intensity of 33.1 mW when the LED device 200A having the electron barrier layer 270A (i.e., a layer with a fixed aluminum concentration) is applied. By contrast, as shown in Table 4 and FIG. 16D, when the structure is changed to the LED device 200D having the electron barrier layer 270D and the interlayer 280D, the luminous intensity may be increased drastically, from the original 33.1 mW to 54.0 mW. Additionally, from Table 4 and FIG. 16D, the structure of the LED device 200D may facilitate to reduce the energy band discontinuity effects between the electron barrier layer 270D and the quantum barrier layer closest to the p-type semiconductor layer 240, and to improve the hole injection and reduce the resistance between the interfaces, so as to facilitate reducing the forward turn-on voltage, from the original 4.28V to 4.17V.

Moreover, referring to Table 4 and FIG. 16D, in the LED device 200D, the thickness $t_2$ of the interlayer 280D is 10 nm and the thickness $t_3$ of the electron barrier layer 270D is 15 nm. In other words, the thickness $t_2$ of the interlayer and the thickness $t_3$ of the electron barrier layer satisfy the specific relationship, i.e, $t_2$ (10 nm) $\leq 0.9 t_3$ (15 nm×0.9=13.5 nm), which may also achieve the afore-described effects. In other words, by having the thickness $t_2$ of the interlayer and the thickness $t_3$ of the electron barrier layer to satisfy the specific relationship, i.e., $t_2 \leq 0.9 t_3$, electrons may be prevented to tunnel through the electron barrier layer, from the quantum barrier layer closest to the p-type semiconductor layer to the p-type semiconductor layer. Thus, the electron confinement effects are improved, thereby enhancing the afore-described effects.

To be more specific, as shown in FIG. 16D, the variation rate obtained from the changes of the lattice constant $a_2$ and the thickness $t_2$ of the interlayer 280D, satisfies the following relationships. Namely, since the change of the lattice constant $a_2$ of the interlayer 280D may be treated as the change of the aluminum concentration of the interlayer 280D, for instance, an aluminum concentration changed from x % to y % may correspond to the lattice constant changed from $a_x$ Å to $a_y$ Å. Therefore, the variation rate, m, obtained from the changes of the lattice constant $a_2$ and the thickness $t_2$ of the interlayer 280D may be calculated by the following formula (I):

$$m = \frac{\left(\left|\frac{a_y - a_x}{a_x}\right| \times 100\%\right)}{t_2} \quad (1)$$

In other words, when the variation rate, m, obtained from the changes of the lattice constant $a_2$ and the thickness $t_2$ of the interlayer 280D, satisfies the relationship, i.e., $m \geq 9 \times 10^{-4}$(%/Å), the effects such as improving the electron confinement effects, reducing electron overflow, increasing the hole injection and enhancing the luminous intensity may be achieved. In the present embodiment, when the aluminum concentration is 17%, the corresponding lattice constant is 3.1761 Å, and when the aluminum concentration, a, is equal to 0.25, the corresponding lattice constant is 3.1699 Å, and thus in the case of the thickness $t_2$=10 nm (100 Å), where:

$$m = \frac{\left(\left|\frac{3.1699 - 3.1761}{3.1761}\right| \times 100\%\right)}{100} = 1.95 \times 10^{-3} (\%/\text{Å}).$$

In view of the foregoing, in the first exemplary embodiment, by inserting the interlayer (that having a lattice constant is different from that of the quantum barrier layer and the electron barrier layer) between the electron barrier layer and the quantum barrier layer closest to the p-type semiconductor layer in the active layer, namely, by having the aluminum concentration closest to the p-type semiconductor layer substantially greater than the aluminum concentration closest to the n-type semiconductor layer, the electron confinement effects may be improved effectively, the electron overflow activity may be reduced, and both the hole injection efficiency and the luminous intensity may be enhanced.

Additionally, as indicated in Table 4, in the first exemplary embodiment, by having the thickness $t_2$ of the interlayer and the thickness $t_3$ of the electron barrier layer to satisfy the specific relationship of $t_2 \leq 0.9 t_3$, in particular, having the variation rate obtained from the changes of the lattice constant and the thickness of the interlayer (as shown in FIG. 16D) greater than or equal to $9 \times 10^{-4}$(%/Å), the electron confinement effects may also be improved effectively, the electron overflow activity may be reduced, and both the hole injection efficiency and the luminous intensity may be enhanced.

In another embodiment, FIG. 20A to FIG. 20D respectively are schematic diagrams illustrating structures of the LED devices according to a second exemplary embodiment. The details of layer structure in the LED devices 200A and 200E-200G depicted in FIG. 20A to FIG. 20D are clearly illustrated in the structures depicted in FIG. 14 and FIG. 15 except that the elements of the interlayers and the structures of the electron barrier layers depicted in FIG. 20A to FIG. 20D are changed. In other words, in the second embodiment, the interlayer is the implementation of the polarization field reversal interlayer, with the rest of the layers being the same as described above, and so further elaboration is omitted.

Figure 20A:
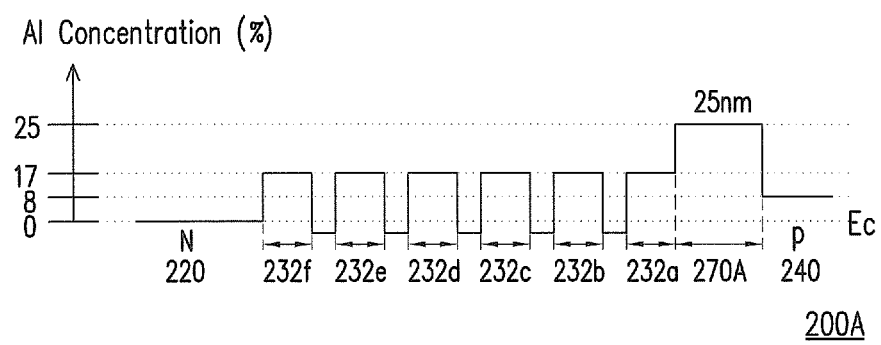
FIG. 20A to FIG. 20D respectively are schematic diagrams illustrating structures of the LED devices according to a second exemplary embodiment.
Figure 20B:
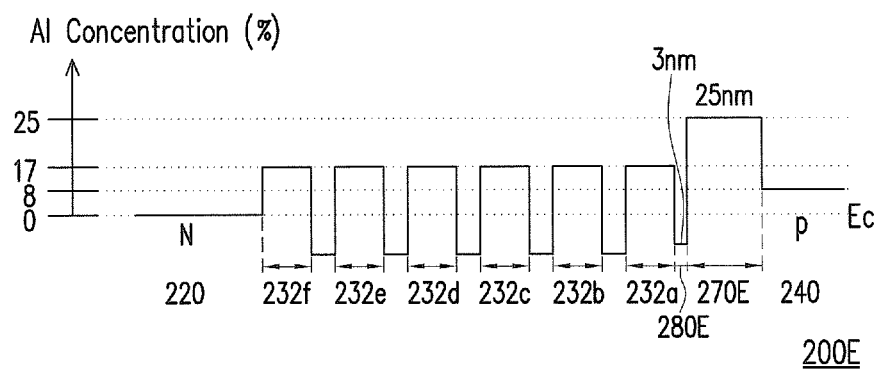
Figure 20C:
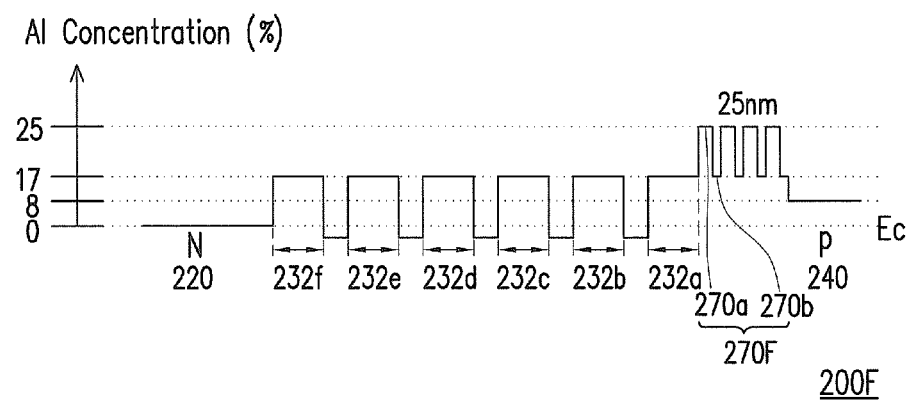
Figure 20D:
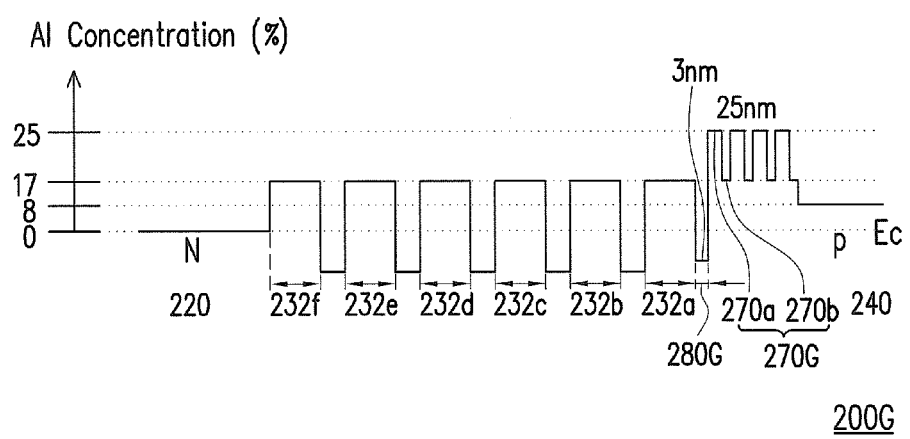

Referring to FIG. 20B, in the LED device 200E, a gallium nitride (GaN) epitaxial layer having a thickness of 3 nm is inserted between the electron barrier layer 270E and the quantum barrier layer closest to the p-type semiconductor layer 240, in order to serve as the interlayer 280E. At this time, the interlayer 280E belongs to the polarization field reversal interlayer type, and the electron barrier layer 270E is the same as that illustrated in FIG. 20A. Referring to FIG. 20C and FIG. 20D, the electron barrier layers 270F and 270G are designed apart into four loops (namely, four repeating units) in the LED devices 200F and 200G. In other words, the electron barrier layers 270F and 270G respectively includes four stacked layers in which one first sub electron barrier layers 270a and one second sub electron barrier layers 270b is as a repeating unit, in which the first sub electron barrier layer 270a is located adjacent to a side of the active layer 230, and the aluminum concentration of the first sub electron barrier layers 270a is different from the aluminum concentration of the second sub electron barrier layers 270b. As shown in FIG. 20C, the first and the second sub electron barrier layers 270a and 270b of the LED device 200F comprises $Al_{0.25}Ga_{0.75}N$ and $Al_{0.17}Ga_{0.83}N$, respectively. As shown in FIG. 20C, the aluminum concentration of the first sub electron barrier layer 270a is greater than that of the second sub electron barrier layer 270b. Certainly, in other embodiments, the aluminum concentration of the first sub electron barrier layer 270a may also be smaller than that of the second sub electron barrier layer 270b, although the disclosure is not limited thereto.

Moreover, referring to FIG. 20D, based on the layer structure of the LED device 200F depicted in FIG. 20C, in the LED device 200G, a GaN epitaxial layer having a thickness of 3 nm is inserted between the electron barrier layer 270G and the quantum barrier layer closest to the p-type semiconductor layer 240, in order to serve as the interlayer 280G. The first sub electron barrier layer 270a is in contact with the interlayer 280G. At this time, the interlayer 280G belongs to the polarization field reversal interlayer type.

Figure 21:
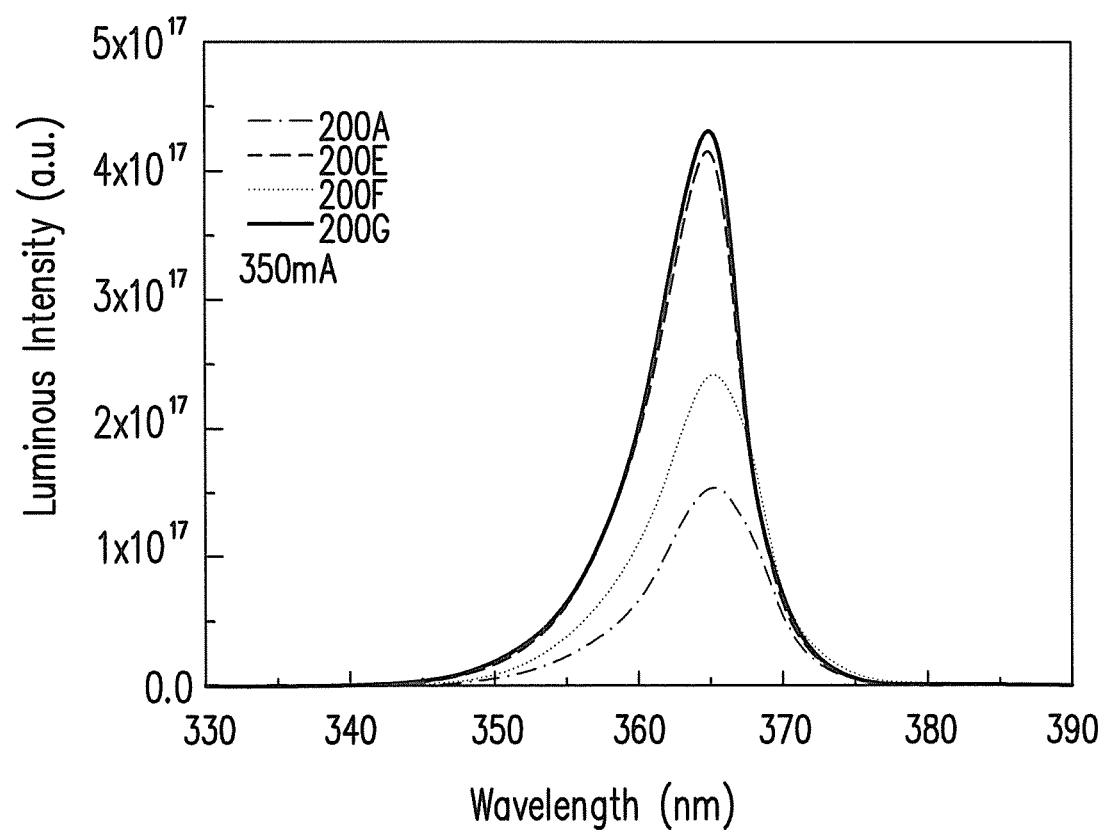
FIG. 21 is a simulation diagram illustrating luminous intensity of the LED devices depicted in FIG. 20A to FIG. 20D.

FIG. 21 is a simulation diagram illustrating luminous intensity of the LED devices depicted in FIG. 20A to FIG. 20D. From FIG. 21, when the electron barrier layer comprises four loops (four repeating units of stacked layers) derived from $Al_{0.25}Ga_{0.75}N$ (i.e., serves as the first sub electron barrier layers 270a) and $Al_{0.17}Ga_{0.83}N$ (i.e., serves as the second sub electron barrier layers 270b), the luminous intensity thereof is higher than that of the electron barrier layer having the fixed aluminum concentration. For instance, the luminous intensity of the LED device 200G depicted in FIG. 20D is greater than the luminous intensity of the LED device 200E depicted in FIG. 20B, and the luminous intensity of the LED device 200F depicted in FIG. 20C is greater than the luminous intensity of the LED device 200A depicted in FIG. 20A.

Moreover, referring to FIG. 21, when a GaN epitaxial layer served as the interlayer 280E/280G is inserted between the electron barrier layer 270E/270G and the quantum barrier layer closest to the p-type semiconductor layer 240, the luminous intensity can be enhanced drastically, even with the electron barrier layer having the fixed aluminum concentration in the LED device 200A, for instance.

Referring to FIG. 21, FIG. 20A and FIG. 20B, the luminous intensity of the LED device 200E having the interlayer 280E inserted between the electron barrier layer 270E (i.e., a layer with a fixed aluminum concentration) and the quantum barrier layer closest to the p-type semiconductor layer 240, is greater than that of the LED device 200A depicted in FIG. 20A without having the interlayer inserted at the afore-described location. Moreover, referring to FIG. 21, FIG. 20C and FIG. 20D, the luminous intensity of the LED device 200G having the interlayer 280G inserted between the electron barrier layer 270G (i.e., comprising four loops with the variable aluminum concentration) and the quantum barrier layer closest to the p-type semiconductor layer 240, is greater than that of the LED device 200F depicted in FIG. 20C without having the interlayer inserted at the afore-described location.

Figure 22A:
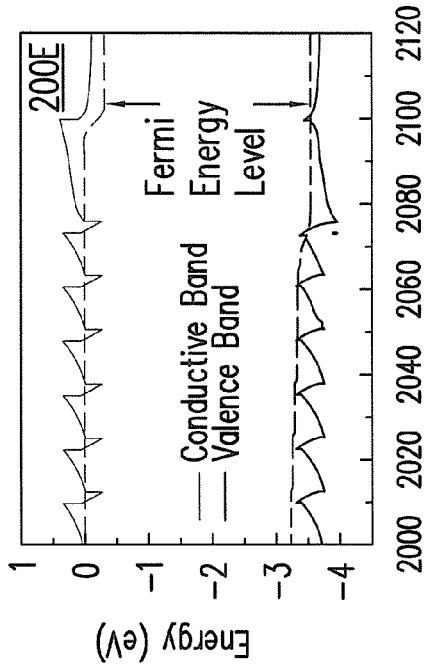
FIG. 22A to FIG. 22D respectively are simulation diagrams illustrating conductive bands and valence bands of the LED devices depicted in FIG. 20A to FIG. 20D when a current of 350 mA is applied.
Figure 22B:
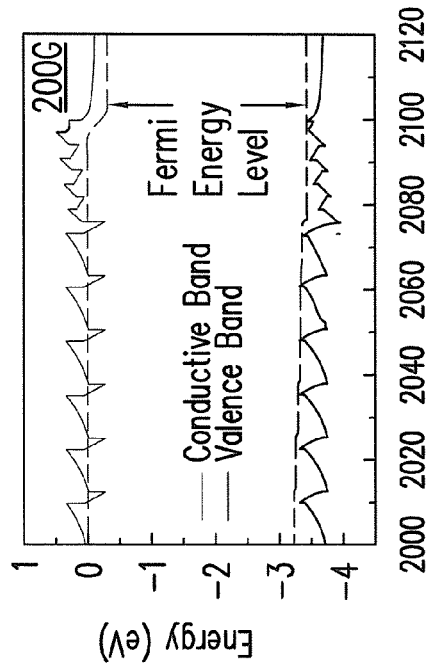
Figure 22C:
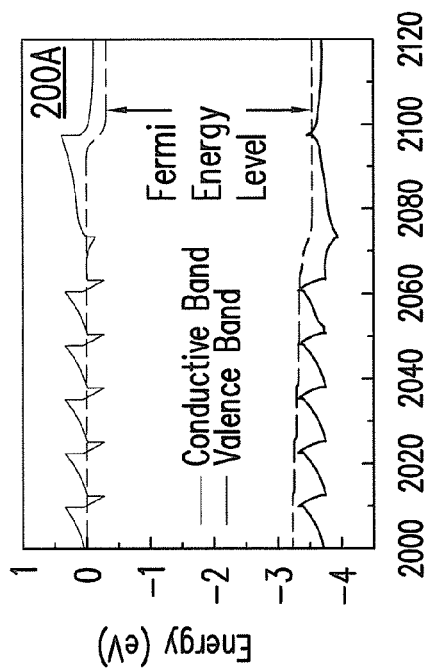
Figure 22D:
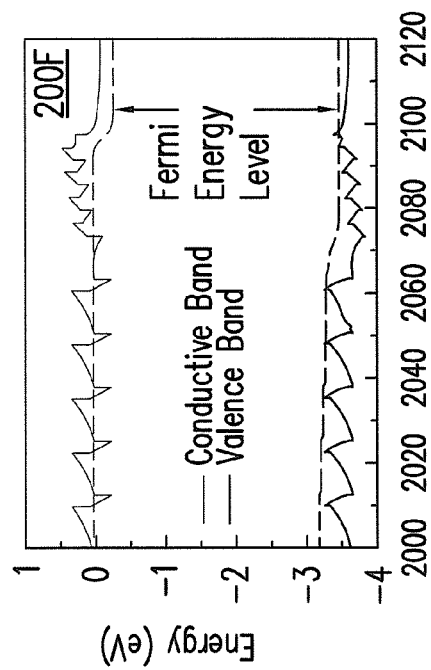

FIG. 22A to FIG. 22D respectively are simulation diagrams illustrating conductive bands and valence bands of the LED devices depicted in FIG. 20A to FIG. 20D when a current of 350 mA is applied. As shown in FIG. 22A and FIG. 22C, when the electron barrier layer comprises the four loops derived from alternating $Al_{0.25}Ga_{0.75}N$ for being the first sub electron barrier layers 270a with $Al_{0.17}Ga_{0.83}N$ for being the second sub electron barrier layers 270b, the energy band discontinuity between the electron barrier layer 270A and the p-type semiconductor layer 240 may be removed. Thus, holes being blocked between the electron barrier layer 270A and the p-type semiconductor layer 240 may be reduced, thereby improving the hole injection efficiency.

Additionally, as to the ultraviolet LED device, the electron barrier layer and the quantum barrier layer thereof are usually used AlGaN, wherein the aluminum concentration of the electron barrier layer is greater than that of the quantum barrier layer. Therefore, in the present embodiment, by inserting the GaN epitaxial layer between the electron barrier layer and the quantum barrier layer closest to the p-type semiconductor layer to serve as the polarization field reversal interlayer, the polarization field direction of the polarization field reversal interlayer and the quantum barrier layer is different from the polarization field direction of the quantum barrier layer and the electron barrier layer. In other words, since the polarization field direction of GaN and AlGaN is different form the polarization field direction of AlGaN and AlGaN, the conductive band energy level may be effectively increased to be higher than the Fermi energy level and the potential barrier for holes injection may be reduced, thereby improving the hole injection efficiency.

Embodiment IV

In this embodiment, by having k layers of quantum wells individually constituted by auxiliary layer and light emitting layer in the active layer, in which the indium concentration of the auxiliary layer is greater than an indium concentration of the light emitting layer, or by having k layers of quantum wells individually constituted by auxiliary layer and light emitting layer in the active layer, in which the lattice constants among the auxiliary layer, the light emitting layer and the quantum barrier layer satisfy specific relationships, the carrier recombination rate of the LED device can be enhanced. Accordingly, by employing any one of the afore-described techniques, the luminous intensity of the LED device in the embodiment can be drastically increased.

Figure 23A:
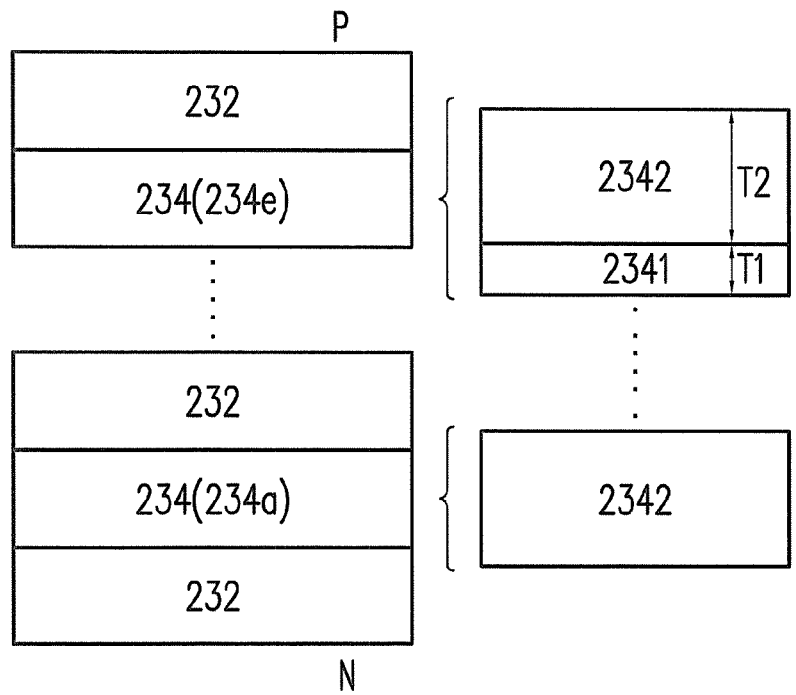
FIG. 23A and FIG. 23B respectively are schematic cross-sectional diagrams illustrating structure pattern of a single quantum well in the LED device depicted in FIG. 1.
Figure 23B:
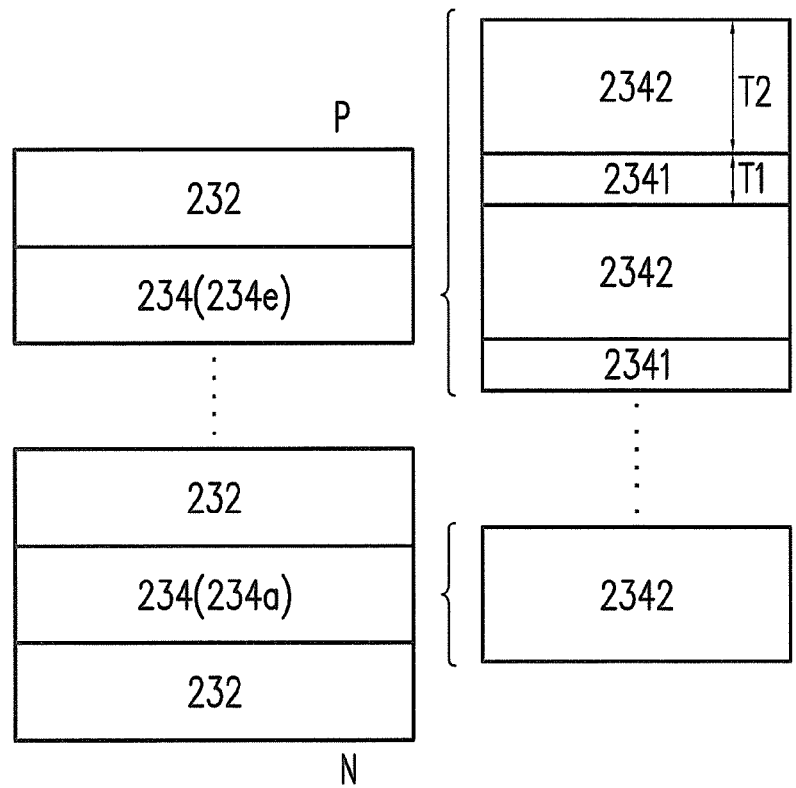

FIG. 23A and FIG. 23B respectively are schematic cross-sectional diagrams illustrating structure pattern of a single quantum well in the LED device depicted in FIG. 1, in which FIG. 23A illustrates a pair of a light emitting layer and an auxiliary layer in a quantum well of the active layer, and FIG. 23B illustrates multiple pairs of a light emitting layer and an auxiliary layer in a quantum well of the active layer. The structure of the active layer 230 in this embodiment is employed the arrangement depicted in FIG. 3, that is, the quantum barrier layers 232a-232f, counting from the n-type semiconductor layer 220, are sequentially 232a, 232b, 232c, 232d, 232e, and 232f, and the quantum wells 234a-234e, counting from the n-type semiconductor layer 220, are sequentially 234a, 234b, 234c, 234d, and 234e.

Referring to FIG. 23A, in the active layer 230, each of a portion of the quantum wells may be constituted by a pair of an auxiliary layer 2341 and a light emitting layer 2342, and each of the rest of the quantum wells may be composed of a light emitting layer 2342. In the embodiment, the number of the quantum wells having the auxiliary layer 2341 is three, although the disclosure is not limited thereto.

As shown in FIG. 23A, the quantum well (e.g. the quantum well 234a closed to n-type semiconductor layer) is constituted of a light emitting layer, and in each of the quantum wells (e.g. the quantum well 234e closest to p-type semiconductor layer 240 as shown in FIG. 3) having the auxiliary layer 2341, the light emitting layer 2342 is disposed between the auxiliary layer 2341 and the p-type semiconductor layer 240 (as shown in FIG. 3 and FIG. 23A). For example, in the active layer 230 with the single quantum well (as shown in FIG. 2A), counting from the p-type semiconductor layer 240, the stacking layers of the quantum barrier layer 232, the light emitting layer 2342, the auxiliary layer 2341, the quantum barrier layer 232 are formed in sequence on the p-type semiconductor layer 240.

As shown in FIG. 23B, the single quantum well 234 (e.g. the quantum well 234e closest to p-type semiconductor layer 240, as shown in FIG. 3) in the active layer 230 can further have another pair of an auxiliary layer 2341 and a light emitting layer 2342, such that the single quantum well active layer 230A is a quantum barrier layer 232/two pairs of light emitting layer 2342 and auxiliary layer 2341 in the quantum well 234/quantum barrier layer 232 structure. The number of pairs of auxiliary layer 2341 and light emitting layer 2342 illustrated in the single quantum well of the embodiment is one and two, although the disclosure is not limited thereto.

In general, when the waveband is shifted close to the ultraviolet (UV) waveband, the indium concentration is gradually decreased in the active layer, such that the self-assembled indium-riched regions are lessened correspondingly. Consequently, the carriers are likely to move to the defect areas in the LED device and the non-radiative recombination of electrons and holes may be occurred, thereby drastically decreasing the luminous intensity of the LED device at the ultraviolet wavelengths.

By contrast, when the quantum well in the active layer is constituted by one pair or multiple pairs of auxiliary layer 2341 and light emitting layer 2342, the auxiliary layer 2341 is capable of increasing the self-assembled indium-riched regions formed in the light emitting layer 2342, thereby enhancing the luminous intensity of the LED device, in which the indium concentration of the auxiliary layer 2341 is greater than the indium concentration of the light emitting layer 2342.

The luminous intensity of the LED device results under different structures of the single quantum well depicted in FIG. 23A and FIG. 23B is shown in Table 5. The quantum well 234 without the auxiliary layer 2341 in the active layer 230 may be considered as composed of the light emitting layer 2342, in the embodiment.

TABLE 5

| LED device 200 | Structure of a quantum well 234 | Output Power (mW) |
|---|---|---|
| I | a single quantum well | 79 |
| II | a pair (2342/2341) | 146 |
| III | two pairs (2342/2341/2342/2341) | 170 |

As shown in the results of Table 5, the output powers of the LED device 200 increase as the number of auxiliary layers 2341 in the single quantum well becomes available. To be specific, when the quantum well 234 is composed of the light emitting layer 2342 (i.e., without the auxiliary layer 2341), the output power thereof is 79 mW. When the light emitting layers 2342 is disposed between the auxiliary layer 2341 and the p-type semiconductor layer 240 (such as, is located above the auxiliary layer 2341 close to the p-type semiconductor layer 240), the quantum well 234 is constituted by a pair of the auxiliary layer 2341 and the light emitting layer 2342, and the output power thereof is increased from 79 mW to 146 mW. When there are two pairs of auxiliary layer 2341 and light emitting layer 2342 in the single quantum well 234 (such as, counting from the p-type semiconductor layer 240, in a light emitting layer 2342/auxiliary layer 2341/light emitting layer 2342/auxiliary layer 2341 arrangement), the output power of the LED device can be drastically increased from 79 mW to 170 mW, which is a twofold enhancement. Therefore, it can be inferred from the results presented in Table 5 that, by inserting the auxiliary layer 2341 between the light emitting layer 2342 and the n-type semiconductor layer 220, the luminous intensity of the LED device 200 can be effectively increased.

To sum up, in the LED device according to the embodiments of the disclosure, by having the at least one nano-patterned structure on the growth surface of the carrier, the lattice dislocation extending in a thickness direction can be effectively decreased and the thickness of the semiconductor layer grown to be coalesced on the nano-patterned structure can also be reduced. Moreover, the afore-described carrier may be incorporated with any one of certain configurations of the active layer (that is, a layer number of doped quantum barrier layers or a thickness of the quantum barrier layers satisfies a certain relationship, an insertion of interlayer between an electron barrier layer and a quantum barrier layer closest to the p-type semiconductor layer, or a portion of the quantum wells having at least one pair of light emitting layer and auxiliary layer), such that the carrier recombination rate of the LED device can be enhanced, and the defect density of the LED device can also be reduced. Accordingly, the luminous intensity of the LED device at the 222 nm-405 nm wavelength range in the disclosure can be drastically increased at ultraviolet wavelengths less than 365 nm.

Figure 24:
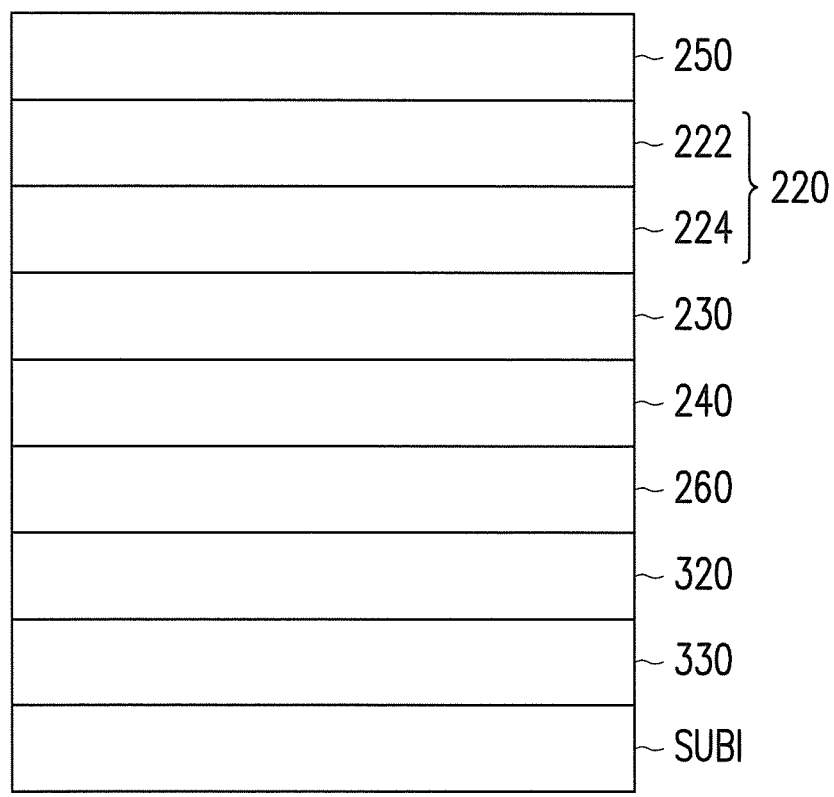
FIG. 24 is an implementation of an LED device in the disclosure.
Figure 25:
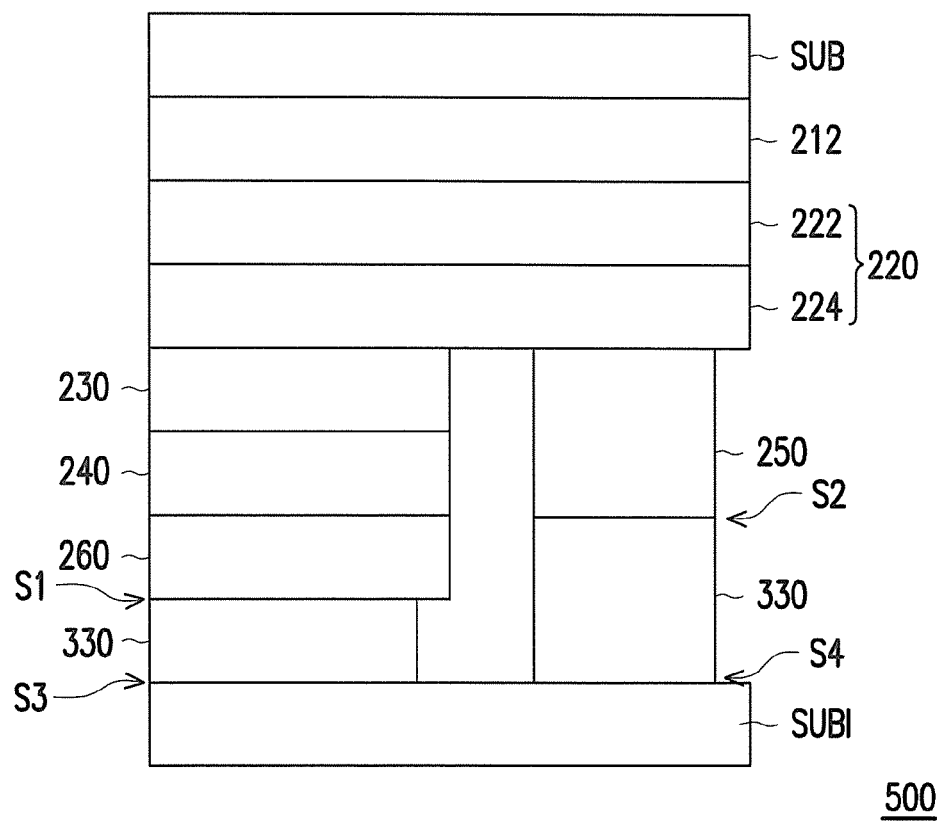
FIG. 25 is another implementation of an LED device in the disclosure.
Figure 26:
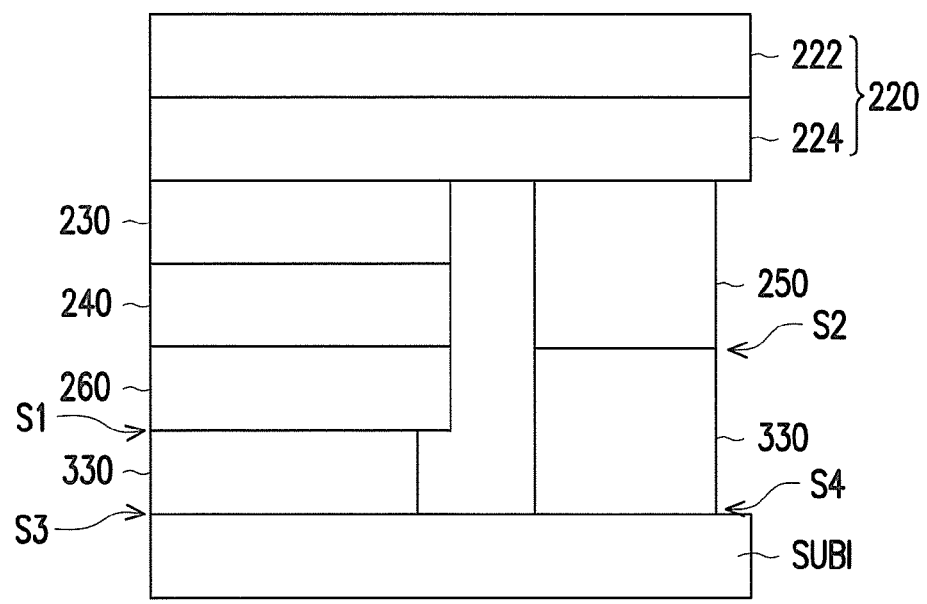
FIG. 26 is yet another implementation of an LED device in the disclosure.

Moreover, the LED device of the disclosure is not limited to the embodiments depicted above. The LED device may be configured with horizontal electrodes or vertical electrodes, both of which can implement the disclosure but should not be construed as limiting the disclosure. For example, the structure of the LED device in the disclosure may be implemented, as shown in FIG. 24 to FIG. 26, in which the active layer depicted in FIG. 24 through FIG. 26 can employ the afore-described carrier (that has at least one nano-patterned structure on the growth surface of the carrier) and the active layer (as illustrated in EMBODIMENT I through EMBODIMENT IV). The detailed description may be referred to the descriptions above, which is not repeated therein. Furthermore, the same reference numbers are used in the drawings and the description to refer to the same or like parts, and so further elaboration is omitted.

FIG. 24 is an implementation of an LED device in the disclosure. As shown in FIG. 24, the LED device 400, from top to bottom, sequentially includes the first electrode 250, the n-type semiconductor layer 220 including the first n-type doped AlGaN layer 222 and the second n-type doped AlGaN layer 224, the active layer 230, the p-type semiconductor layer 240 and the second electrode 260 that are described above; a reflective layer 320; a bonding layer 330; and a carrier substrate SUBI. Moreover, in the actual applications, the LED device 400 depicted in FIG. 24 is capable of being rotated 180 degrees as a whole, so that the carrier substrate SUBI is located at the top of the LED device 400 instead of being at the bottom to implement. The top-bottom relative positions illustrated here are an exemplary scope for implementation, although the disclosure is not limited thereto.

FIG. 25 is another implementation of an LED device in the disclosure. As shown in FIG. 25, the LED device 500, from top to bottom, sequentially includes the substrate SUB, the nitride semiconductor capping layer 212, the n-type semiconductor layer 220 including the first n-type doped AlGaN layer 222 and the second n-type doped AlGaN layer 224, and the carrier substrate SUBI, in which two stacked layers are sandwiched between the n-type semiconductor layer 220 and the carrier substrate SUBI. As shown in FIG. 25, the first stacked layer comprises the active layer 230, the p-type semiconductor layer 240, the second electrode 260 and the bonding layer 330 (i.e., first bonding layer), which is located on the left-hand side of FIG. 25. Furthermore, the second stacked layer is located on the right-hand side of the first stacked layer, and is separated away from the first stacked layer by a distance, in which the second stacked layer comprises the first electrode 250 and the bonding layer 330 (i.e., second bonding layer). Moreover, according to the demand for the components, in the LED device 500, a reflective layer may be disposed between the second electrode 260 and the bonding layer 330 (i.e., first bonding layer) of the first stacked layer that is located on the left-hand side of the LED device 500 (such as, an insert position S1 of the reflective layer shown in FIG. 24), or may be disposed between the first electrode 250 and the bonding layer 330 (i.e., second bonding layer) of the second stacked layer that is located on the right-hand side of the LED device 500 (such as, an insert position S2 of the reflective layer shown in FIG. 25), or the reflective layers may simultaneously exist at the afore-described insert positions (i.e., S1 and S2). In addition, the reflective layer may also be disposed between the carrier substrate SUBI and the bonding layer 330 (i.e., first bonding layer) of the first stacked layer that is located on the left-hand side of the LED device 500 (such as, an insert position S3 of the reflective layer shown in FIG. 25), and between the carrier substrate SUBI and the bonding layer 330 (i.e., second bonding layer) of the second stacked layer that is located on the right-hand side of the LED device 500 (such as, an insert position S4 of the reflective layer shown in FIG. 25). As such, the light emitted from the active layer 230 is capable of being reflected to a predetermined path via the reflective layer, although the disposition position of the reflective layer is not limited in the disclosure.

FIG. 26 is yet another implementation of an LED device in the disclosure. As shown in FIG. 26, the layer structure of the LED device 600 is similar to FIG. 25 except that the substrate SUB and the nitride semiconductor capping layer 212 located above the n-type semiconductor layer 220 are omitted in the LED device 600 of FIG. 26, as compared with the LED device 500 depicted in FIG. 25. Furthermore, the same reference numbers are used in the drawings and the description to refer to the same or like parts, and so further elaboration is omitted. Similarly, according to the demand for the components, in the LED device 600, a reflective layer may be disposed between the second electrode 260 and the bonding layer 330 (i.e., first bonding layer) of the first stacked layer that is located on the left-hand side of the LED device 600 (such as, an insert position S1 of the reflective layer shown in FIG. 26), or may be disposed between the first electrode 250 and the bonding layer 330 (i.e., second bonding layer) of the second stacked layer that is located on the right-hand side of the LED device 600 (such as, an insert position S2 of the reflective layer shown in FIG. 26), or the reflective layers may simultaneously exist at the afore-described insert positions (i.e., S1 and S2). In addition, the reflective layer may also be disposed between the carrier substrate SUBI and the bonding layer 330 (i.e., first bonding layer) of the first stacked layer that is located on the left-hand side of the LED device 600 (such as, an insert position S3 of the reflective layer shown in FIG. 26), and between the carrier substrate SUBI and the bonding layer 330 (i.e., second bonding layer) of the second stacked layer that is located on the right-hand side of the LED device 600 (such as, an insert position S4 of the reflective layer shown in FIG. 26). As such, the light emitted from the active layer 230 is capable of being reflected to a predetermined path via the reflective layer.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A light emitting diode (LED) device, comprising:
   a carrier, having a growth surface and at least one nano-patterned structure on the growth surface, wherein the carrier comprises a substrate and a semiconductor capping layer;
   an n-type semiconductor layer and a p-type semiconductor layer, located over the growth surface of the carrier, wherein the semiconductor capping layer is disposed between the substrate and the n-type semiconductor layer;
   an active layer located between the n-type semiconductor layer and the p-type semiconductor layer, wherein a wavelength $\lambda$ of light emitted by the active layer is 222 nm$\leq\lambda\leq$405 nm, and a defect density of the active layer is less than or equal to $5\times10^{10}/cm^2$; and
   a first electrode and a second electrode, respectively connected to the n-type semiconductor layer and the p-type semiconductor layer.

2. The LED device according to claim 1, wherein a defect density of the semiconductor capping layer is less than or equal to $1\times10^{10}/cm^2$.

3. The LED device according to claim 1, the at least one nano-patterned structure is on a surface of the substrate, and the semiconductor capping layer covers and is in contact with the at least one nano-patterned structure.

4. The LED device according to claim 1, wherein the substrate has a plane surface, the semiconductor capping layer covers the plane surface, the at least one nano-patterned structure is on a surface of the semiconductor capping layer, and the n-type semiconductor layer covers and is in contact with the at least one nano-patterned structure.

5. The LED device according to claim 1, wherein the substrate has a patterned surface, the semiconductor capping layer covers the patterned surface, the at least one nano-patterned structure is on a surface of the semiconductor capping layer, and the n-type semiconductor layer covers and is in contact with the at least one nano-patterned structure.

6. The LED device according to claim 1, wherein a thickness of the semiconductor capping layer is less than or equal to 10 μm, and ranges from 1 μm to 4 μm.

7. The LED device according to claim 1, wherein a material of the semiconductor capping layer comprises gallium nitride (GaN), aluminum gallium nitride (AlGaN), aluminum nitride (AlN), indium gallium nitride (InGaN) or a combination thereof.

8. The LED device according to claim 1, wherein the at least one nano-patterned structure comprises a plurality of mesas, and a recess is formed between two adjacent mesas.

9. The LED device according to claim 8, wherein the mesas of the at least one nano-patterned structure are arranged regularly.

10. The LED device according to claim 8, wherein the mesas of the at least one nano-patterned structure are arranged randomly.

11. The LED device according to claim 8, wherein a depth of the recess ranges from 10 nm to 500 nm, and a dimension of the mesa ranges from 10 nm to 800 nm.

12. The LED device according to claim 8, wherein a dimension $w_1$ of the mesa and a dimension $w_2$ of the recess satisfy the following relationship:

$$0.0125 \leq [w_1/w_2] \leq 80.$$

13. The LED device according to claim 1, wherein a plurality of voids are formed above the recesses or above the mesas between the substrate and the n-type semiconductor layer.

14. The LED device according to claim 13, wherein each of the voids has a refraction coefficient n2, the substrate has a refraction coefficient n1 and the semiconductor capping layer has a refraction coefficient n3, where n3>n2>n1.

15. The LED device according to claim 8, further comprising:
   a mask layer, covering sidewalls of each mesa and a bottom surface of each recess between the two adjacent mesas.

16. The LED device according to claim 15, wherein a thickness of the mask layer ranges from 0.1 μm to 2 μm.

17. The LED device according to claim 15, wherein a material of the mask layer comprises silicon dioxide, silicon nitride or silicon oxynitride.

* * * * *